United States Patent
Kim et al.

(10) Patent No.: US 10,699,927 B1
(45) Date of Patent: Jun. 30, 2020

(54) INSPECTION APPARATUS AND SEMICONDUCTOR STRUCTURE-MANUFACTURING APPARATUS INCLUDING THE SAME

(71) Applicant: SAMSUNG ELECTRONICS CO., LTD., Suwon-si, Gyeeongi-do (KR)

(72) Inventors: Wookrae Kim, Suwon-si (KR); Kwangsoo Kim, Pyeongtaek-si (KR); Gwangsik Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/509,835

(22) Filed: Jul. 12, 2019

(30) Foreign Application Priority Data

Dec. 10, 2018 (KR) .................. 10-2018-0158377

(51) Int. Cl.
| | |
|---|---|
| *G01N 21/00* | (2006.01) |
| *H01L 21/67* | (2006.01) |
| *H01L 21/66* | (2006.01) |
| *H01L 27/22* | (2006.01) |
| *G01N 21/88* | (2006.01) |
| *H01L 43/12* | (2006.01) |
| *G01N 21/95* | (2006.01) |
| *H01L 43/02* | (2006.01) |

(52) U.S. Cl.
CPC ... *H01L 21/67288* (2013.01); *G01N 21/8806* (2013.01); *G01N 21/9501* (2013.01); *H01L 22/12* (2013.01); *H01L 27/228* (2013.01); *H01L 43/02* (2013.01); *H01L 43/12* (2013.01)

(58) Field of Classification Search
CPC . H01L 21/67288; H01L 22/12; H01L 27/228; H01L 43/02; H01L 43/12; G01N 21/8806; G01N 21/9501
See application file for complete search history.

(56) References Cited

U.S. PATENT DOCUMENTS

| | | | |
|---|---|---|---|
| 5,684,565 A | 11/1997 | Oshida et al. | |
| 5,717,485 A | 2/1998 | Ito et al. | |
| 6,040,895 A | 3/2000 | Haas | |
| 6,768,543 B1 | 7/2004 | Aiyer | |
| 6,963,401 B2 | 11/2005 | Opsal et al. | |
| 7,046,353 B2 | 5/2006 | Isozaki et al. | |
| 7,061,600 B2 | 6/2006 | Maeda et al. | |
| 7,136,163 B2 | 11/2006 | Borden et al. | |
| 7,221,444 B1 | 5/2007 | Zhao | |
| 7,719,673 B2 | 5/2010 | Oshima et al. | |

(Continued)

FOREIGN PATENT DOCUMENTS

KR 10-1174081 B1 8/2012

OTHER PUBLICATIONS

PVEducation. (2019). Absorption Coefficient. Retrieved from https://www.pveducation.org/pvcdrom/pn-junctions/absorption-coefficient.

*Primary Examiner* — Peter B Kim

(74) *Attorney, Agent, or Firm* — Myers Bigel, P.A.

(57) ABSTRACT

An inspection apparatus includes a first optical module including a first light source configured to emit first light to a semiconductor structure, a second light source configured to emit second light different from the first light to a portion adjacent to a portion to which the first light is emitted in the semiconductor structure, a detector configured to detect the second light reflected toward the second light source, and a lock-in amplifier connected to the first optical module and the detector.

20 Claims, 19 Drawing Sheets

(56) References Cited

U.S. PATENT DOCUMENTS

| | | |
|---|---|---|
| 7,816,152 B2 | 10/2010 | Yoo et al. |
| 7,973,919 B2 | 7/2011 | Grossman et al. |
| 7,973,921 B2 | 7/2011 | Silberstein et al. |
| 9,772,297 B2 | 9/2017 | Nicolaides et al. |
| 9,863,758 B2 | 1/2018 | Komaragiri et al. |
| 2010/0188658 A1* | 7/2010 | Grossman .............. G01N 21/17 356/237.5 |
| 2012/0305774 A1* | 12/2012 | Kiwa ................ G01N 21/3581 250/341.1 |

* cited by examiner

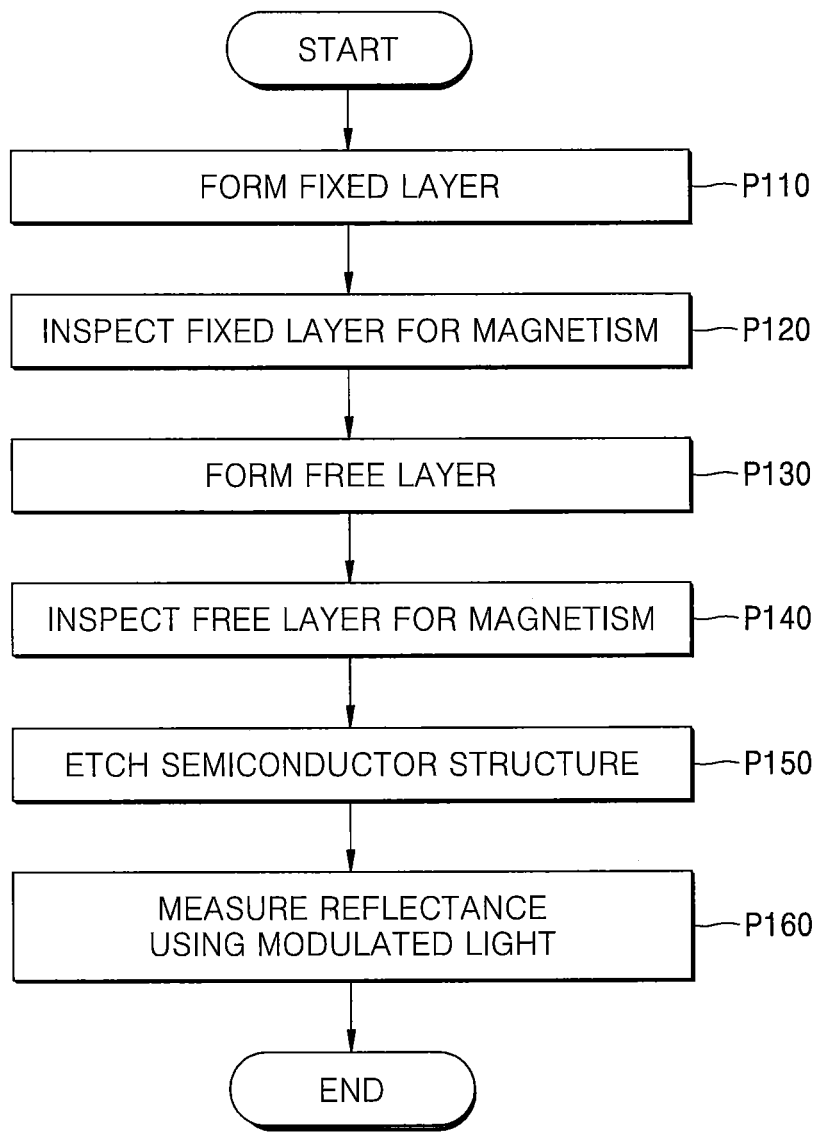

INSPECTION APPARATUS AND SEMICONDUCTOR STRUCTURE-MANUFACTURING APPARATUS INCLUDING THE SAME

CROSS-REFERENCE TO RELATED APPLICATION

This application claims the benefit of Korean Patent Application No. 10-2018-0158377, filed on Dec. 10, 2018, in the Korean Intellectual Property Office, the disclosure of which is incorporated herein in its entirety by reference.

BACKGROUND

The inventive concept relates to an inspection apparatus and a semiconductor structure-manufacturing apparatus including the same, and more particularly, to an inspection apparatus capable of measuring a defect and a physical property of a semiconductor structure and a semiconductor structure-manufacturing apparatus using the inspection apparatus.

There has been research into increasing the integration density of semiconductor devices. The sizes of defects occurring during the manufacturing processes of semiconductor devices have decreased, and the positions of defects have been expanded from surfaces of a semiconductor structure to inner parts of the semiconductor structure at a depth of several μm from the surfaces of the semiconductor structure. Accordingly, techniques for inspecting a semiconductor structure for micro-defects at a depth of several μm from the top surface of the semiconductor structure are desired. Furthermore, apart from defect detection, techniques for inspecting the uniformity of physical properties, such as magnetism and strain, have increasingly been needed.

SUMMARY

Various embodiments provide an inspection apparatus capable of inspecting a micro-defect and physical property uniformity and a semiconductor structure-manufacturing apparatus including the inspection apparatus.

According to an aspect of the inventive concept, there is provided an inspection apparatus including a first optical module including a first light source configured to emit first light to a semiconductor structure; a second optical module including a second light source and a detector, the second light source being configured to emit second light different from the first light to a portion adjacent to a portion to which the first light is emitted in the semiconductor structure, and the detector being configured to detect the second light reflected toward the second light source; and a lock-in amplifier connected to the first optical module and the detector.

According to another aspect of the inventive concept, there is provided an inspection apparatus including a first optical module including a first light source configured to emit first light obliquely incident to a top surface of a semiconductor structure and a frequency modulator configured to modulate a frequency of the first light; a second light source configured to emit second light different from the first light to a portion adjacent to a portion to which the first light is emitted in the semiconductor structure, the second light being perpendicularly incident to the top surface of the semiconductor structure; a detector configured to detect the second light reflected toward the second light source; and a lock-in amplifier connected to the first optical module and the detector.

According to a further aspect of the inventive concept, there is provided a semiconductor structure-manufacturing apparatus including a process module including at least one of a deposition device and an etching device, the deposition device being configured to deposit material layers including magnetic layers on a semiconductor structure, and the etching device being configured to etch at least a portion of the material layers; and an inspection apparatus configured to inspect the semiconductor structure, wherein the inspection apparatus includes a first optical module including a first light source configured to emit first light to the semiconductor structure, a second light source configured to emit second light different from the first light to a portion adjacent to a portion to which the first light is emitted in the semiconductor structure, a detector configured to detect the second light reflected toward the second light source, and a lock-in amplifier connected to the first optical module and the detector.

BRIEF DESCRIPTION OF THE DRAWINGS

Embodiments of the inventive concept will be more clearly understood from the following detailed description taken in conjunction with the accompanying drawings in which:

FIG. 11 is a flowchart of a semiconductor structure manufacturing method according to some embodiments.

DETAILED DESCRIPTION

Hereinafter, example embodiments of the inventive concept will be described in detail with reference to the accompanying drawings. It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below. As used herein, the term "and/or" includes any and all combinations of one or more of the associated listed items. Expressions such as "at least one of," when preceding a list of elements, modify the entire list of elements and do not modify the individual elements of the list.

Figure 1:
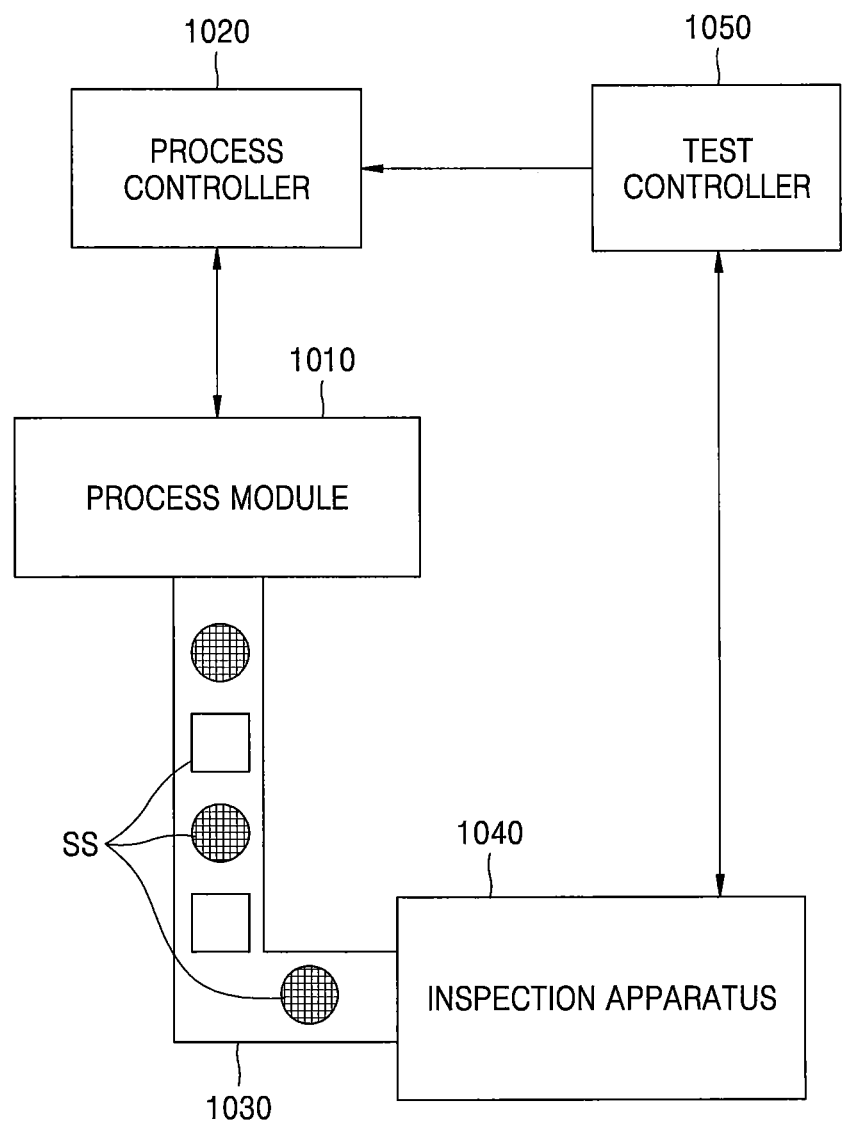
FIG. 1 is a block diagram of a semiconductor structure-manufacturing apparatus including an inspection apparatus, according to some embodiments.

FIG. 1 is a block diagram of a semiconductor structure-manufacturing apparatus 1000 including an inspection apparatus 1040, according to some embodiments. The semiconductor structure-manufacturing apparatus 1000 may include a process module 1010, a process controller 1020, a transfer unit 1030, the inspection apparatus 1040, and a test controller 1050.

According to example embodiments, the process module 1010 may include a plurality of processing devices for manufacturing a semiconductor device or a semiconductor structure SS, which is a workpiece obtained during processes of manufacturing the semiconductor device. For convenience's sake, the description will be based on the semiconductor structure SS, but the inventive concept is not limited thereto. For example, the inventive concept may be applied to completed semiconductor devices in substantially the same manner as described below.

According to some embodiments, the process module 1010 may include a deposition device in which processes such as atomic layer deposition (ALD), physical vapor deposition (PVD), vapor-phase epitaxy (VPE), chemical vapor deposition (CVD), reactive pulsed laser deposition (PLD), and/or molecular beam epitaxy (MBE) may be performed. According to some embodiments, the process module 1010 may include a photolithography device in which processes such as spin coating, exposure, post-bake, and/or development may be performed. According to some embodiments, the process module 1010 may include various processing devices, such as an etching device, in which dry etch and wet etch may be performed, and/or a chemical-mechanical polishing (CMP) device. The process module 1010 may produce and provide the semiconductor structure SS to the transfer unit 1030.

The process controller 1020 may control the process module 1010. The process controller 1020 may include a computing device such as a workstation computer, a desktop computer, a laptop computer, or a tablet computer. The process controller 1020 may include software performing functions such as receiving feedback on a process, receiving inspection data, and adjusting the process.

According to example embodiments, the semiconductor structure SS may include a semiconductor wafer or a group of semiconductor wafers, i.e., a semiconductor wafer lot. The semiconductor structure SS may undergo all or at least one of manufacturing processes. According to some embodiments, the semiconductor structure SS may include a multi-layer structure. According to some embodiments, the semiconductor structure SS may include a high-aspect ratio opening and/or recess. According to some embodiments, the semiconductor structure SS may include a magnetic layer.

The transfer unit 1030 may include a sophisticated clean room transport system which may transport the semiconductor structure SS produced in the process module 1010. The transfer unit 1030 may include a conveyor system or the like. The transfer unit 1030 may deliver the semiconductor structure SS to the inspection apparatus 1040. According to some embodiments, the transfer unit 1030 may transport the semiconductor structure SS that has undergone inspection to a processing device, which is the same as or different from a processing device in which a previous process has performed on the semiconductor structure SS in the process module 1010. In some embodiments, a separate transfer unit may be further provided to transport the semiconductor structure SS that has undergone inspection to a processing device, which is the same as or different from a processing device in which a previous process has performed on the semiconductor structure SS in the process module 1010.

According to some embodiments, the inspection apparatus 1040 may not be implemented as a separate station or chamber, but may be integrated with the transfer unit 1030 and/or test controller 1050. In detail, the inspection apparatus 1040 may be located adjacent to the transfer unit 1030, which transports the semiconductor structure SS between different processing devices, or a pre-aligner provided for a certain processing device. Accordingly, the inspection apparatus 1040 may inspect the semiconductor structure SS based on a trigger signal generated by a sensor connected to the transfer unit 1030 and the pre-aligner and may perform total inspection of the semiconductor structure SS without a turnaround time (TAT) since there is no time consumed for a separate process.

The inspection apparatus 1040 may perform a nondestructive inspection on the semiconductor structure SS. According to some embodiments, the inspection apparatus 1040 may inspect the semiconductor structure SS for a defect and a physical property, using an optical inspection.

According to some embodiments, the inspection apparatus 1040 may inspect the semiconductor structure SS for various optical characteristics. In detail, the inspection apparatus 1040 may inspect the semiconductor structure SS for a reflectance characteristic. According to some embodiments, the inspection apparatus 1040 may inspect the semiconductor structure SS for reflectance characteristics with respect to size- and/or frequency-modulated light and for the characteristic of a change in reflectance. However, the inventive concept is not limited thereto. The inspection apparatus 1040 may further inspect the semiconductor structure SS for various optical characteristics, such as polarization reflectance, polarized-light reflection delay, group velocity, and group-delay dispersion. According to some embodiments, the inspection apparatus 1040 may inspect a semiconductor device for various physical properties, such as magnetism, strain, and stress, and for the uniformity of each physical property.

The test controller 1050 may control the inspection apparatus 1040. According to some embodiments, test controller 1050 may analyze inspection data received from the inspection apparatus 1040. According to example embodiments, the test controller 1050 may include a computing device, such as a workstation computer, a desktop computer, a laptop computer, or a tablet computer, which includes at least one software product capable of controlling the operation of the inspection apparatus 1040.

According to some embodiments, the test controller 1050 may compare an optical characteristic such as reflectance, various physical properties such as magnetism, strain, and stress, and the uniformity thereof with preset threshold values. According to some embodiments, the test controller 1050 may compare a shift in each of an optical characteristic such as reflectance, various physical properties such as magnetism, strain, and stress, and the uniformity thereof with a preset shift reference or threshold value. According to some embodiments, the comparison may be performed by a look-up function for data stored in the test controller 1050 and/or comparison with offline data. According to some embodiments, reference values compared with an optical characteristic such as reflectance, various physical properties such as magnetism, strain, and stress, and the uniformity thereof may be input from an external source.

The test controller 1050 may store and analyze test data. The test controller 1050 may provide analysis data to the process controller 1020. The process controller 1020 may transmit a feedback signal to the process module 1010 based on the analysis data. The process module 1010 may adjust and/or select a process based on the feedback signal. The feedback signal may be on a wafer-to-wafer or lot-to-lot basis or may be based on a difference between wafers in a lot. When the feedback signal is on a wafer-to-wafer basis, the semiconductor structure SS undergoing measurement corresponds to a wafer and a succeeding process for the semiconductor structure SS corresponding to the wafer may be adjusted and/or selected. Similarly, when the feedback signal is on a lot-to-lot basis, a process for the semiconductor structure SS included in a succeeding lot may be adjusted based on a result of inspecting semiconductor devices included in a current lot.

Such feedback may be performed based on a period of a reliability test performed by the inspection apparatus 1040. The feedback may influence various parameters, which are used to perform and/or select a process in the process module 1010 manufacturing the semiconductor structure SS. For example, the process controller 1020 may adjust at least one process parameter according to an inspection result. Examples of process parameters may include temperature, pressure, period, composition and concentration of a process gas, and a processing voltage, but are not limited thereto.

The semiconductor structure-manufacturing apparatus 1000 may manufacture various semiconductor devices involving various techniques. The inspection apparatus 1040 may monitor in real time various semiconductor structures manufactured by the semiconductor structure-manufacturing apparatus 1000. For example, the inspection apparatus 1040 may inspect complementary metal-oxide-semiconductor (CMOS) devices, flash devices, BiCMOS devices, power devices, static random access memory (SRAM) devices, magnetic RAM (MRAM) devices, resistive RAM (ReRAM) devices, dynamic RAM (DRAM) devices, NAND memory devices, VNAND memory devices, other various semiconductor devices, and/or semiconductor structures thereof during manufacturing processes.

Figure 2:
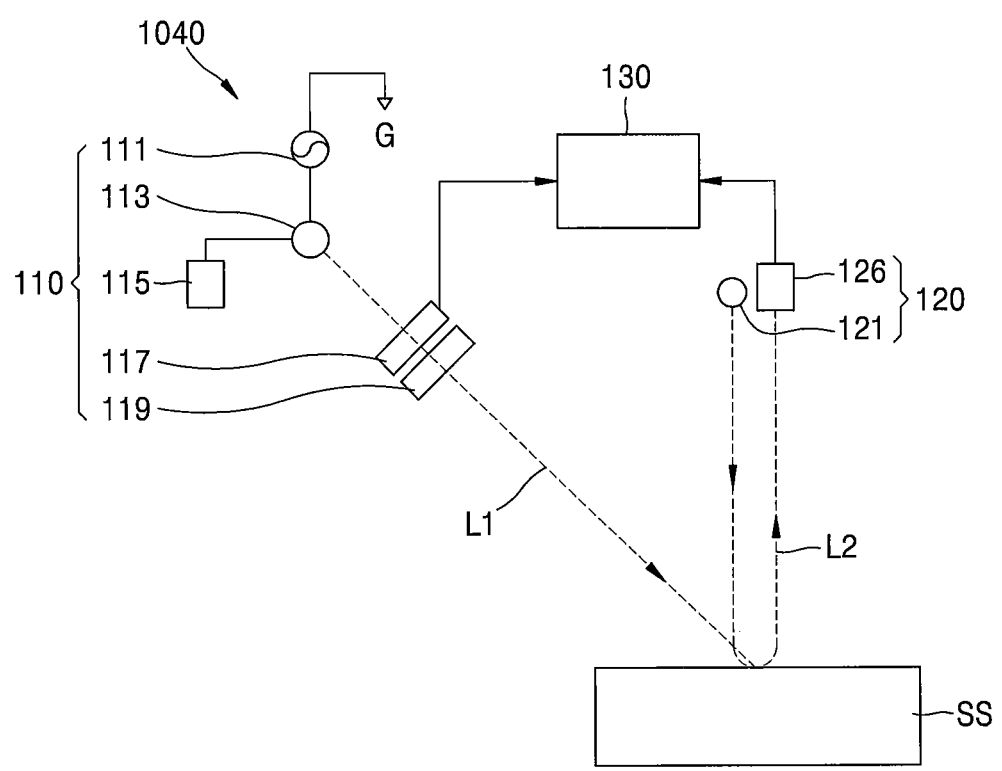
FIG. 2 is a cross-sectional view of an inspection apparatus according to some embodiments.

FIG. 2 is a cross-sectional view of the inspection apparatus 1040 according to some embodiments. Referring to FIG. 2, the inspection apparatus 1040 may include a first optical module 110, a second optical module 120, and a lock-in amplifier 130. According to some embodiments, the first optical module 110 may include a power supply 111, a first light source 113, a frequency modulator 115, an intensity modulator 117, and an optical chopper 119.

Although the power supply 111 is shown as an alternating current (AC) power supply connected to a ground G in FIG. 2, the inventive concept is not limited thereto. For example, the power supply 111 may be a direct current (DC) power supply or a power supply including a rectify circuit and a smoothing circuit. The power supply 111 may supply the first light source 113 with power which has a root mean square changing over time. However, the inventive concept is not limited thereto, and the power supply 111 may supply power having a constant root mean square to the first light source 113. It will be understood that, although the terms first, second, third, etc. may be used herein to describe various elements, and elements should not be limited by these terms; rather, these terms are only used to distinguish one element from another element. Thus, a first element discussed could be termed a second element without departing from the scope of the present inventive concepts.

The first light source 113 may emit first light L1 such as visible light, ultraviolet light, an excimer laser beam, extreme ultraviolet light (EUV), an X-ray, or an electron beam. The frequency modulator 115 may be connected to the first light source 113 and may modulate the frequency (or wavelength) of the first light L1 emitted from the first light source 113. In other words, when the frequency of the first light L1 is modulated, it does not mean a change in frequency components, which is calculated by a Fourier-transform of a signal, but means that the frequency is modulated such that the wavelength (e.g., color or the energy of a photon) of the first light L1 is modulated. According to some embodiments, the frequency modulator 115 may apply a certain electrical signal to the first light source 113 to modulate the frequency (or wavelength) of the first light L1, but the inventive concept is not limited thereto. For example, a first light source may be capable of frequency modulation, and a frequency modulator may be omitted.

Figure 3A:
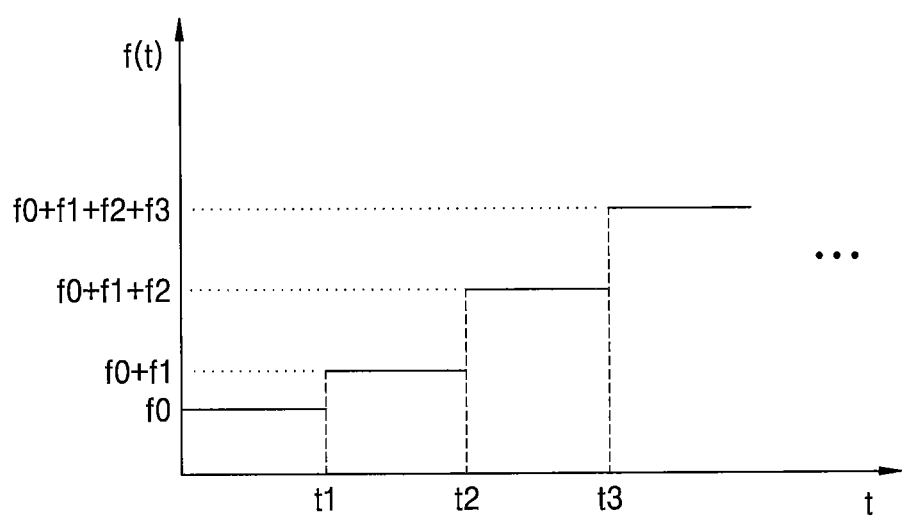
FIGS. 3A through 3C are graphs for explaining frequency modulation of a first optical module included in an inspection apparatus, according to some embodiments.
Figure 3B:
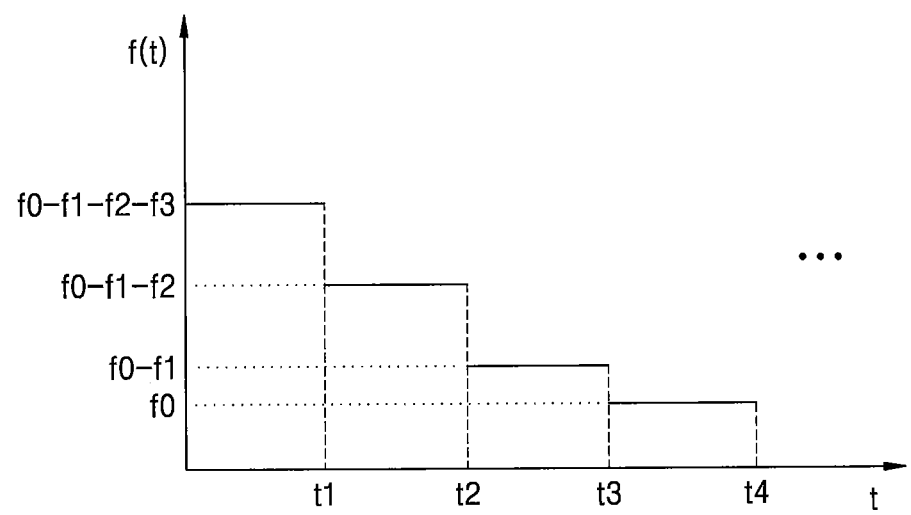
Figure 3C:
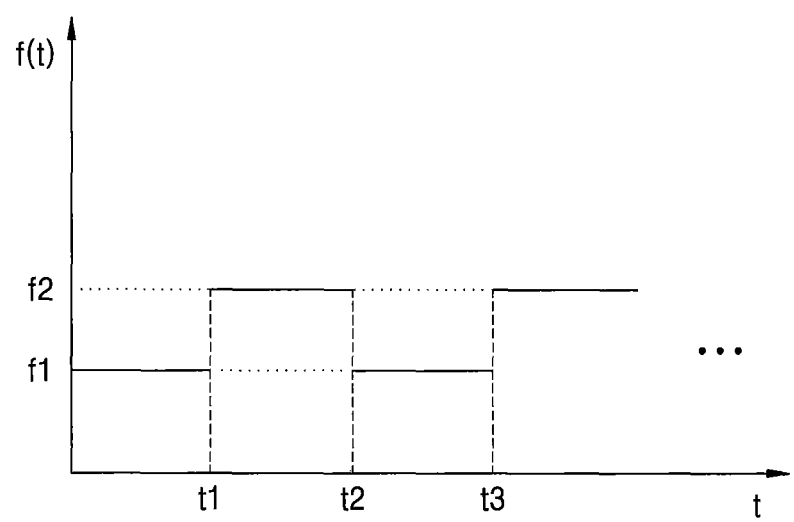

The modulation of the frequency of the first light L1 will be described with reference to FIGS. 3A through 3C. FIGS. 3A through 3C are graphs for explaining frequency modulation of the first optical module 110 included in the inspection apparatus 1040, according to some embodiments.

Referring to FIGS. 2 and 3A, the first optical module 110 may emit the first light L1 of which the frequency increases over time. According to some embodiments, the frequency of the first light L1 may increase stepwise. According to some embodiments, when time is "t", the frequency of the first light L1 may be determined by Equation 1:

$$f(t)=f0+f1\cdot u(t-t1)+f2\cdot u(t-t2)+f3\cdot u(t-t3)+\ldots, \quad (1)$$

where f0, f1, f2, and f3 are preset frequency values, t1, t2, and t3 are a series of preset times, and u(t) may be a unit step function.

Referring to FIGS. 2 and 3B, the first optical module 110 may emit the first light L1 of which the frequency decreases over time. According to some embodiments, the frequency of the first light L1 may decrease stepwise. According to some embodiments, when time is "t", the frequency of the first light L1 may be determined by Equation 2:

$$f(t)=f0-f1\cdot u(t-t1)-f2\cdot u(t-t2)-f3\cdot u(t-t3)+\ldots, \quad (2)$$

where f0 through f3 and t1 through t3 may be the same as defined in Equation 1.

Referring to FIGS. 2 and 3C, the first optical module 110 may emit the first light L1 of which the frequency alternately changes over time. According to some embodiments, the frequency of the first light L1 may alternately have a first frequency value f1 and a second frequency value f2, which are different from each other. According to some embodiments, when time is "t", the frequency of the first light L1 may be determined by Equation 3:

$$f(t)=f1+(f2-f1)\cdot u(t-t1)+(f1-f2)\cdot u(t-t2)+(f2-f1)\cdot u(t-t3)+\ldots, \quad (3)$$

where t1, t2, and t3 are a series of preset times.

Referring back to FIG. 2, the intensity modulator 117 may modulate the intensity of the first light L1. According to some embodiments, the intensity modulator 117 may periodically modulate the intensity of the first light L1. According to some embodiments, an intensity function I(t) of the first light L1 over the time "t" may satisfy Equation 4:

$$I(t)=I0+IM\cdot\sin(\omega\cdot t), \quad (4)$$

where I0 is an average intensity, IM is a width of a modulation signal, and ω is an angular frequency of intensity modulation. However, the inventive concept is not limited thereto. According to some embodiments, the first light L1 may be a periodic function including a square wave and a triangle wave. The intensity modulator 117 may be connected to the lock-in amplifier 130.

An optical chopper 119 may periodically interrupt the first light L1. The optical chopper 119 may include a variable frequency rotating disc chopper, a fixed frequency tuning fork chopper, or an optical shutter but is not limited thereto. A chopping frequency is set according to a motor speed and the number of slots in a rotating disc and may be limited by a disc radius and a beam diameter.

According to some embodiments, the first light L1 may be characterized by the first optical module 110 to have a preset modulation frequency (or a variable wavelength), a preset modulation intensity, and a preset chopping frequency. The first light L1 may be emitted to the semiconductor structure SS.

Figure 4A:
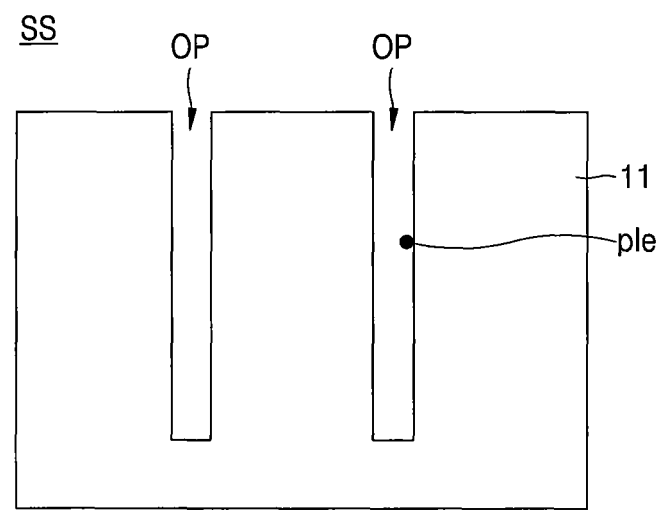
FIGS. 4A and 4B are schematic cross-sectional views of respective semiconductor structures that may be inspected by an inspection apparatus, according to some embodiments.
Figure 4B:
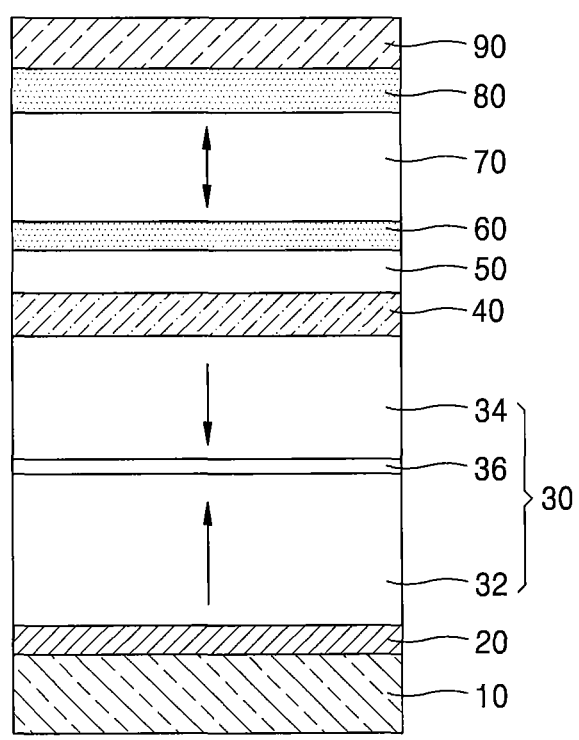

The semiconductor structure SS will be described with reference to FIGS. 4A and 4B. FIGS. 4A and 4B are schematic cross-sectional views of respective semiconductor structures SS and SS' that may be inspected by an inspection apparatus, according to some embodiments.

Referring to FIG. 4A, the semiconductor structure SS may include a plurality of openings OP in a semiconductor layer 11. According to some embodiments, the semiconductor layer 11 may include an insulating layer but is not limited thereto. For example, the semiconductor layer 11 may include magnetic layers and conductive layers.

According to some embodiments, the semiconductor layer 11 may include a single layer or multiple layers. According to some embodiments, the semiconductor layer 11 may include a burying insulating film, which includes a silicon oxide and covers a plurality of interlayer dielectric films and a circuit pattern formed at the same level as each of the interlayer dielectric films. According to some embodiments, the semiconductor layer 11 may include silicon oxide layers and silicon nitride layers, which are alternately stacked with each other. According to some embodiments, the semiconductor layer 11 may include a sacrificial mold insulation film for forming a lower electrode.

According to some embodiments, the openings OP may penetrate at least a portion of the semiconductor layer 11. According to some embodiments, the openings OP may have a high aspect ratio. According to some embodiments, the openings OP may be for forming a through hole via. According to some embodiments, the openings OP may be for forming a lower electrode. According to some embodiments, the openings OP may be for forming a channel hole or a word line cut. According to some embodiments, the openings OP may be spaces that are formed in a process of singulating magnetic junction devices and may communicate with one another.

Referring to FIG. 4B, the semiconductor structure SS' may be a magnetic junction device. The semiconductor structure SS' may include an electrode 10, a seed layer 20, a fixed layer 30, a blocking layer 40, a polarization enhancement layer 50, a first tunnel barrier 60, a free layer 70, a second tunnel barrier 80, and a capping layer 90.

The electrode 10 may include a metal or a metal nitride. For example, the electrode 10 may include TiN. In some embodiments, the electrode 10 may include a TiN film having a relatively low N content to realize a low wire resistance. According to some embodiments, the electrode 10 may include a TiN film in which an atomic percent of N is lower than an atomic percent of Ti.

The seed layer 20 may include a material such as Ru, Pt, or Pd. In some embodiments, a buffer layer may be between the electrode 10 and the seed layer 20. The buffer layer may match the crystal structure of the electrode 10 with the crystal structure of the seed layer 20 between the electrode 10 and the seed layer 20. For example, the buffer layer may include Ta or the like.

Although the fixed layer 30 is shown as a synthetic anti-ferromagnetic (SAF) structure including a plurality of structures in FIG. 4B, the inventive concept is not limited thereto. For example, the fixed layer 30 may be implemented as a single layer. The fixed layer 30 may include a first ferromagnetic layer 32, a second ferromagnetic layer 34, and a non-magnetic thin film 36 between the first ferromagnetic layer 32 and the second ferromagnetic layer 34. The SAF structure may exhibit an anti-ferromagnetic coupling (AFC) characteristic due to the Ruderman-Kittel-Kasuya-Yosida (RKKY) interaction. Accordingly, magnetic domains of respective ferromagnetic layers, i.e., the first ferromagnetic layer 32 and the second ferromagnetic layer 34, may be aligned in opposite direction such that the entire magnetization of the SAF structure may be minimized. In other words, the magnetic moment of the second ferromagnetic layer 34 may be anti-parallel to that of the first ferromagnetic layer 32. In addition, the first ferromagnetic layer 32 and the second ferromagnetic layer 34 form the fixed layer 30 such that the magnetization direction of the fixed layer 30 may not be changed.

According to some embodiments, the first ferromagnetic layer 32 and the second ferromagnetic layer 34 may include CoFeB, CoFe, NiFe, FePt, CoPt, or the like. The non-magnetic thin film 36 may include a single metal selected from the group consisting of Ru, Cr, Pt, Pd, Ir, Rh, Os, Re, Au, and Cu or an alloy thereof. According to some embodiments, the first ferromagnetic layer 32 and the second ferromagnetic layer 34 included in the fixed layer 30 are described as examples of materials having an intrinsic perpendicular magnetization characteristic, but embodiments of the inventive concept are not limited thereto.

Although it is shown in FIG. 4B that the magnetization direction of the first ferromagnetic layer 32 is away from the electrode 10 and toward the free layer 70 and the magnetization direction of the second ferromagnetic layer 34 is toward the electrode 10, embodiments are not limited thereto. In other words, the magnetization direction of the first ferromagnetic layer 32 may be toward the electrode 10 and the magnetization direction of the second ferromagnetic layer 34 may be away from the electrode 10.

The polarization enhancement layer 50 may be arranged on the fixed layer 30 to increase the spin polarization of the fixed layer 30. The polarization enhancement layer 50 may include a CoFeB magnetic layer. The magnetization direction of the polarization enhancement layer 50 may be the same as that of the fixed layer 30. The polarization enhancement layer 50 may have a thickness of about 10 Å to about 20 Å.

The blocking layer 40 may be between the polarization enhancement layer 50 and the fixed layer 30. According to some embodiments, the blocking layer 40 may include a metal, an alloy, a metal oxide, a metal nitride, a metal oxynitride, or a combination thereof. According to some embodiments, the blocking layer 40 may include a transition metal. According to some embodiments, the blocking layer 40 may include Mo, W, Ta, Ti, Zr, Hf, V, Nb, or an alloy thereof.

The first tunnel barrier 60 may be arranged on the polarization enhancement layer 50. According to some embodiments, the first tunnel barrier 60 and the second tunnel barrier 80 described below may include an insulating material. For example, the first tunnel barrier 60 and the second tunnel barrier 80 may include magnesium oxide, titanium oxide, aluminum oxide, magnesium zinc oxide, or a magnesium boron oxide.

In some embodiments, at least one of the first tunnel barrier 60 and the second tunnel barrier 80 may be implemented as a single layer. In some embodiments, at least one of the first tunnel barrier 60 and the second tunnel barrier 80 may include multiple layers. For example, at least one of the first tunnel barrier 60 and the second tunnel barrier 80 may have a multi-layer structure selected from Mg/MgO, MgO/Mg, and Mg/MgO/Mg. In some embodiments, the first tunnel barrier 60 may be thicker than the second tunnel barrier 80.

The free layer 70 may be arranged on the first tunnel barrier 60. The free layer 70 has an easy magnetization axis in a direction perpendicular to the extension direction of the free layer 70. In some embodiments, the free layer 70 include a single film or multiple films, which include a material expressed as $Co_aFe_bB_cZ_{(1-a-b-c)}$ (where Z is a dopant, "a", "b", and "c" are each an atomic percent, $0 \leq a \leq 0.9$, $0 \leq b \leq 0.9$, $0 \leq c \leq 0.4$, and "a", "b", and "c" are not 0 simultaneously). The dopant Z in the free layer 70 may include at least one element selected from Si, Cr, Al, Ta, Hf, Zr, Ni, V, Mo, P, C, W, Nb, Mn, and Ge and/or may be omitted in some occasions. In example embodiments, the free layer 70 may be aligned with the (001) crystal face of a body-centered cubic (BCC) structure.

The second tunnel barrier 80 may be formed on the free layer 70. The first tunnel barrier 60 and the second tunnel barrier 80 may include a non-magnetic material. In some embodiments, the first tunnel barrier 60 and the second tunnel barrier 80 may include an oxide of a material selected from Mg, Ti, Al, MgZn, and MgB. In some embodiments, the first tunnel barrier 60 and the second tunnel barrier 80 may include a Ti nitride or vanadium (V) nitride.

The capping layer 90 may be formed on the second tunnel barrier 80. The capping layer 90 may include at least one material selected from Ru, Ta, Al, Cu, Au, Ag, Ti, TaN, and TiN.

Referring back to FIG. 2, the second optical module 120 may include a second light source 121 and a detector 126. According to some embodiments, the second light source 121 may emit second light L2, which is substantially perpendicularly incident to the semiconductor structure SS. According to some embodiments, the second light L2 may be different from the first light L1. According to some embodiments, the second light L2 may have an intensity and a frequency, which are substantially constant.

According to some embodiments, the second light L2 may be emitted to a portion, which is adjacent to a portion to which the first light L1 is emitted. According to some embodiments, the second light L2 may be emitted to a portion, which is adjacent to but spaced apart from a portion to which the first light L1 is emitted. According to some embodiments, a region to which the second light L2 is emitted may partially overlap a region to which the first light L1 is emitted. According to some embodiments, a region to which the second light L2 is emitted may be included in a region to which the first light L1 is emitted. According to some embodiments, a region to which the first light L1 is emitted may be included in a region to which the second light L2 is emitted. According to some embodiments, a region to which the second light L2 is emitted may coincide with a region to which the first light L1 is emitted.

According to some embodiments, the detector 126 may measure a reflectance of the semiconductor structure SS. As described below, the first light L1 emitted to the semiconductor structure SS may change a reflectance of the semiconductor structure SS, and the detector 126 may measure the reflectance and a change in the reflectance. According to some embodiments, the detector 126 may be connected to the lock-in amplifier 130.

The lock-in amplifier 130 may extract a signal with a known carrier wave from an extremely noisy signal. The lock-in amplifier 130 may reliably detect a signal, which is up to a millionth of a noise component, using orthogonality of a trigonometric function. The lock-in amplifier 130 may frequency-convert a measured signal into DC using a heterodyne technique. The lock-in amplifier 130 may include a homodyne detector and a low-pass filter. The low-pass filter may be connected to the homodyne detector and may be capable of tuning a cutoff frequency. According to some embodiments, the lock-in amplifier 130 may be connected to the intensity modulator 117 and may use an intensity modulation frequency of the intensity modulator 117 as a reference frequency. At this time, the lock-in amplifier 130 may detect a component having the same frequency as the intensity modulator 117 in a reflectance measured by the detector 126.

Here, the first light L and the second light L2 may be emitted to the front surface of the semiconductor structure SS in a scanning manner such that the front surface of the semiconductor structure SS may be inspected. Accordingly, a thickness of a certain material layer in the front surface of the semiconductor structure SS may be calculated, existence or non-existence of a defect in the certain material layer may be determined, and physical properties, such as magnetism, stress, and/or strain, of the certain material layer and/or the uniformity thereof may be calculated.

In detail, referring back to FIG. 1, the test controller 1050 may compare a measured reflectance and/or a reflectance of the reference frequency (i.e., intensity modulation frequency) component with stored data. For example, the test controller 1050 may identify the semiconductor structure SS as a failure when a reference frequency component of the reflectance of the semiconductor structure SS is higher or lower than a threshold value. The test controller 1050 may determine that particulate contamination has occurred when the reference frequency component of the reflectance of the semiconductor structure SS is in a first range. In another example, the test controller 1050 may determine that a defect, e.g., a threading defect, has occurred in an underlayer when the reference frequency component of the reflectance of the semiconductor structure SS is in a second range.

A change in the reflectance of the semiconductor structure SS with respect to emission of the first light L1 will be described below. A portion to which the first light L1 is emitted in the semiconductor structure SS may generate various signals according to the physical properties of the semiconductor structure SS. Examples of the various signals may include thermal waves which have a wavelength in a micrometer range and rapidly decay within a distance of about 1 to 2 times the wavelength from which the thermal waves are generated, acoustic waves which appear as lattice vibration in the case of a solid and/or pressure fluctuation in the case of gas and are propagated up to several millimeters, and/or plasma waves which are generated through electron-hole pair generation and recombination. Thermal waves, acoustic waves, and plasma waves may have different intensities and shapes according to polarization of the first light L1 and the physical properties of the semiconductor structure SS and may change a complex refractive index. A changed complex refractive index may result in a change of the the reflectance. A complex refractive index $\underline{n}$ may be defined as Equation 5:

$$\underline{n}=n+ik, \quad (5)$$

where a real number "n" is a refractive index, "i" is an imaginary number, and "k" is an absorption coefficient (or an extinction coefficient).

Figure 5A:
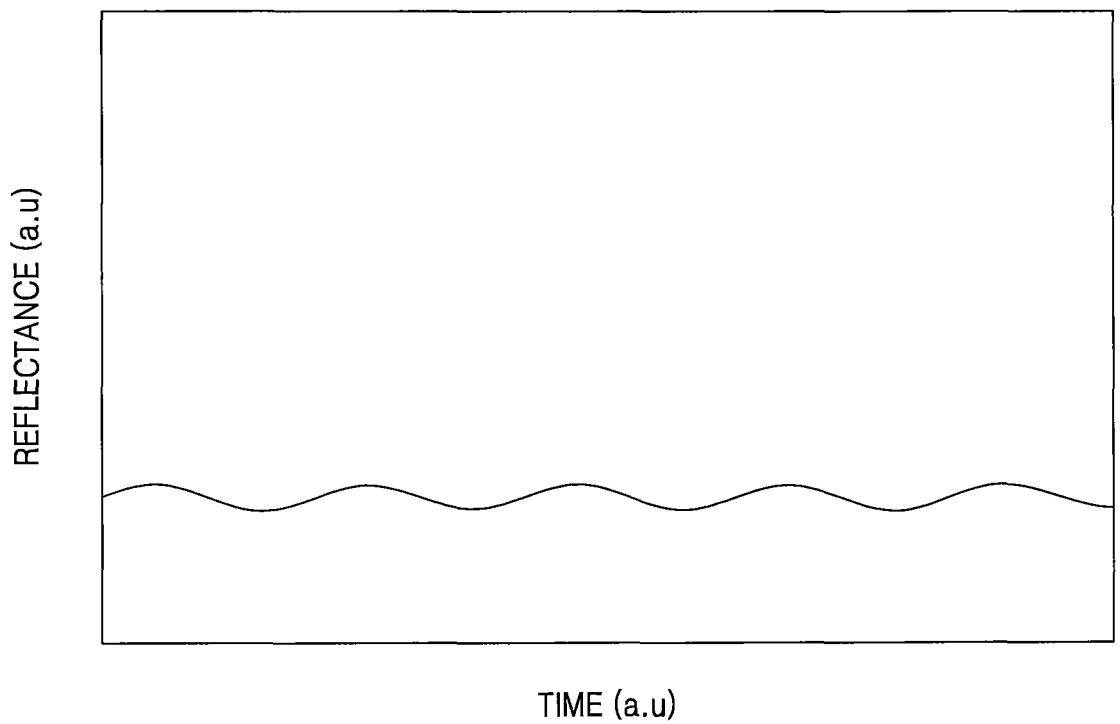
FIGS. 5A and 5B are graphs showing a change in reflectance with respect to a complex refractive index, according to some embodiments.
Figure 5B:
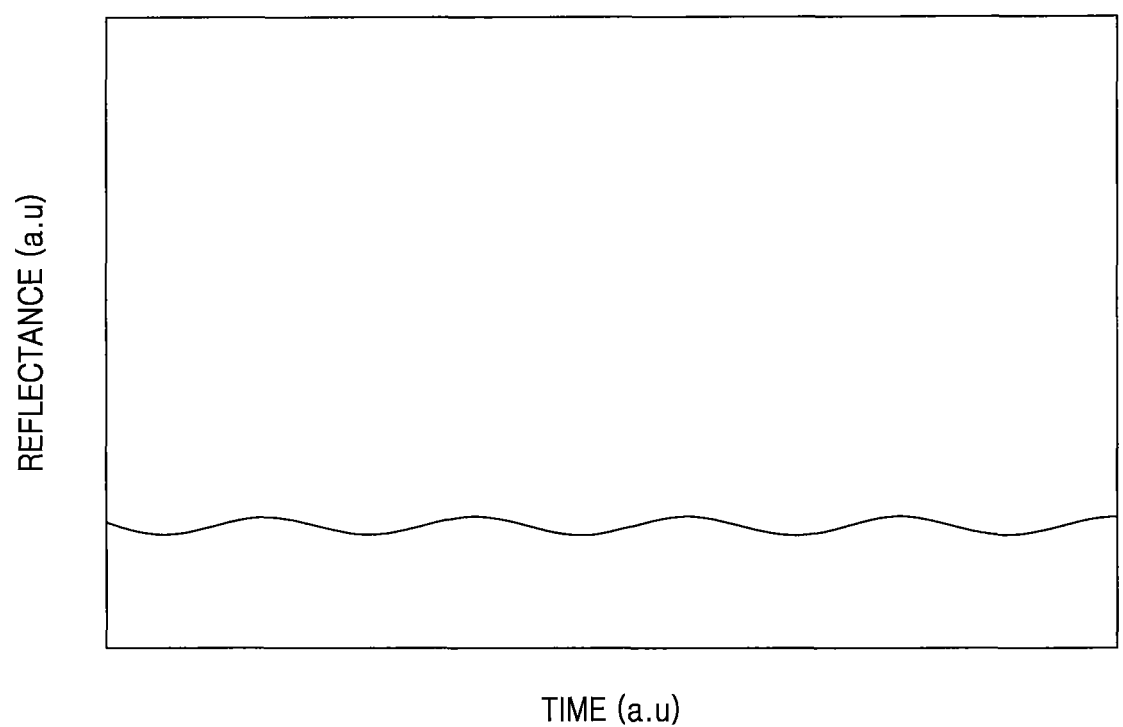

FIGS. 5A and 5B are graphs showing a change in reflectance with respect to values of the refractive index "n" and the absorption coefficient "k" of a complex refractive index. In detail, FIG. 5A is a graph of a reflectance when light is incident to a surface at an angle of π/3 with respect to the normal line to the surface and a change in a value of the absorption coefficient "k" is predominant in the complex refractive index. An effective value of the refractive index "n" may be 1.4, an effective value of the absorption coefficient "k" may be 1.83, and the amplitude of the absorption coefficient "k" may be about 0.1.

FIG. 5B is a graph of a reflectance when light is incident to a surface at an angle of π/3 with respect to the normal line to the surface but, unlike FIG. 5A, a change in a value of the refractive index "n" is predominant in the complex refractive index. An effective value of the refractive index "n" may be 1.4, an effective value of the absorption coefficient "k" may be 1.83, and the amplitude of the refractive index "n" may be about 0.1. Referring to FIGS. 5A and 5B, it may be seen that the values of the refractive index "n" and the absorption coefficient "k" sequentially oscillate over time, and accordingly, the reflectance also oscillates over time.

Figure 6:
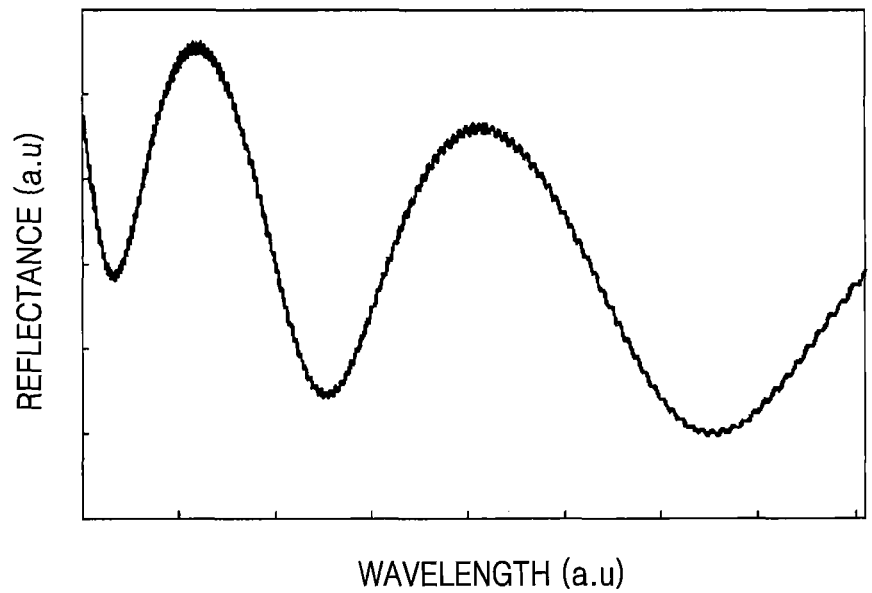
FIG. 6 is a graph of a reflectance with respect to a wavelength incident to a semiconductor structure, according to some embodiments.

FIG. 6 is a graph of a reflectance with respect to a wavelength of light, which is incident to the semiconductor structure SS including the openings OP having a high aspect ratio in FIG. 4A. Referring to FIGS. 4A and 6, the reflectance shows a small modulation with respect to the wavelength, and a change in depth of an opening structure formed in the semiconductor structure SS and existence or non-existence of a particulate contamination "ple" may be checked through fitting based on information of the small modulation.

Figure 7:
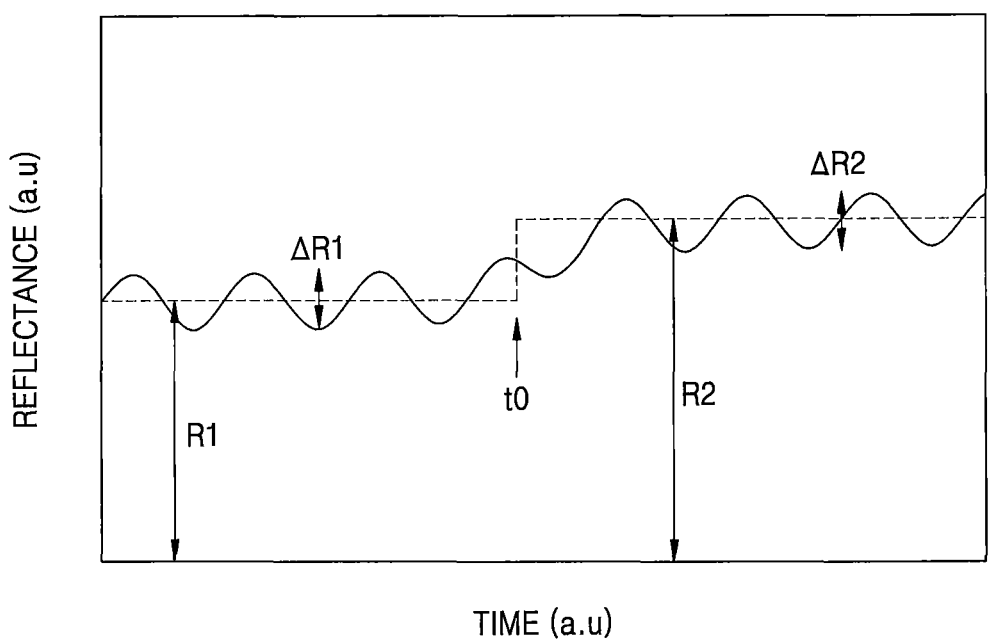
FIG. 7 is a graph for explaining an effect of an inspection apparatus according to some embodiments.

FIG. 7 is a graph for explaining an effect of the inspection apparatus 1040 according to some embodiments. In detail, FIG. 7 shows a change in reflectance with respect to frequency modulation.

Referring to FIGS. 2 and 7, a frequency of the first light L1 may be changed at a time point t0. A height of a plurality of layers may be calculated using an effective reflectance R1 and a reflectance amplitude ΔR1 before frequency modulation, i.e., before the time point t0, and an effective reflectance R2 and a reflectance amplitude ΔR2 after the frequency modulation, i.e., after the time point t0. At this time, even when the reflectance amplitudes ΔR1 and the ΔR2 are very small (for example, less than ⅟1000 of the effective reflectances R1 and R2, respectively), the inspection apparatus 1040 may accurately measure the reflectance amplitudes ΔR1 and the ΔR2 since the inspection apparatus 1040 includes the lock-in amplifier 130.

Figure 8:
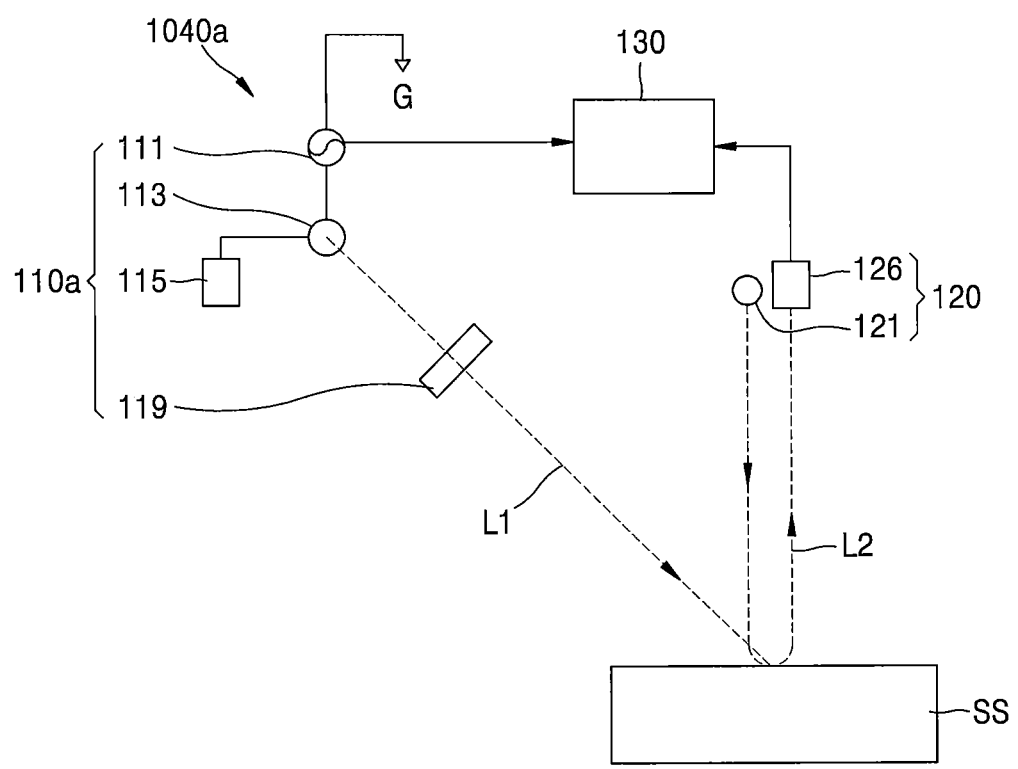
FIGS. 8 through 10 are cross-sectional views of inspection apparatuses according to some embodiments.
Figure 9:
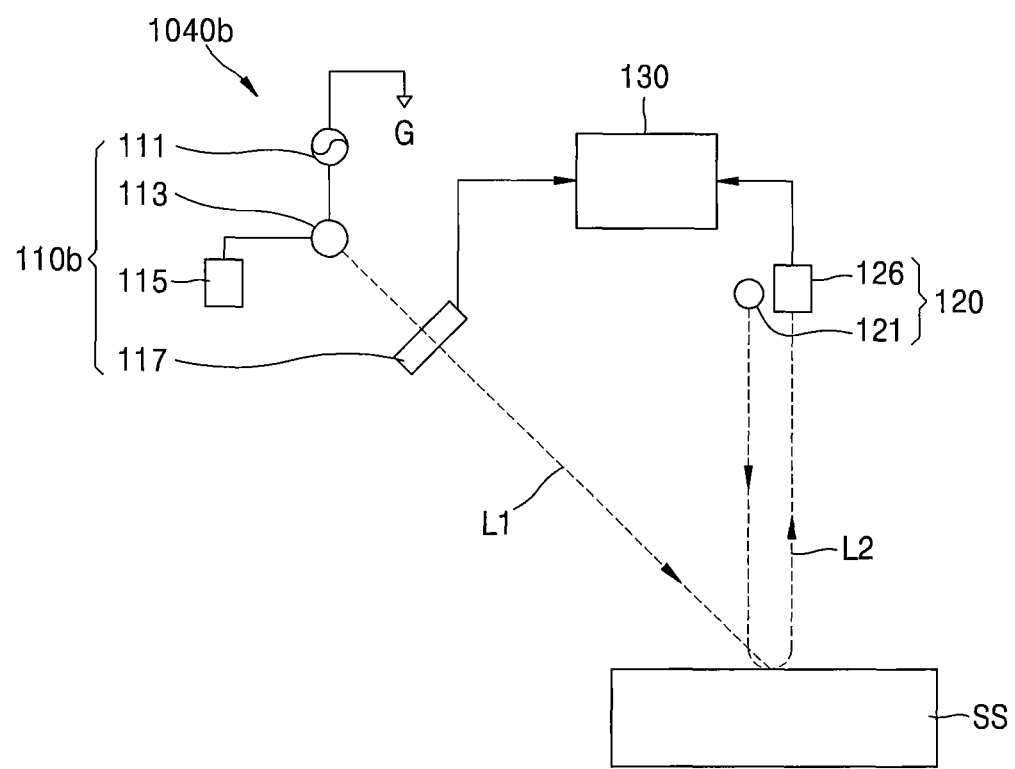
Figure 10:
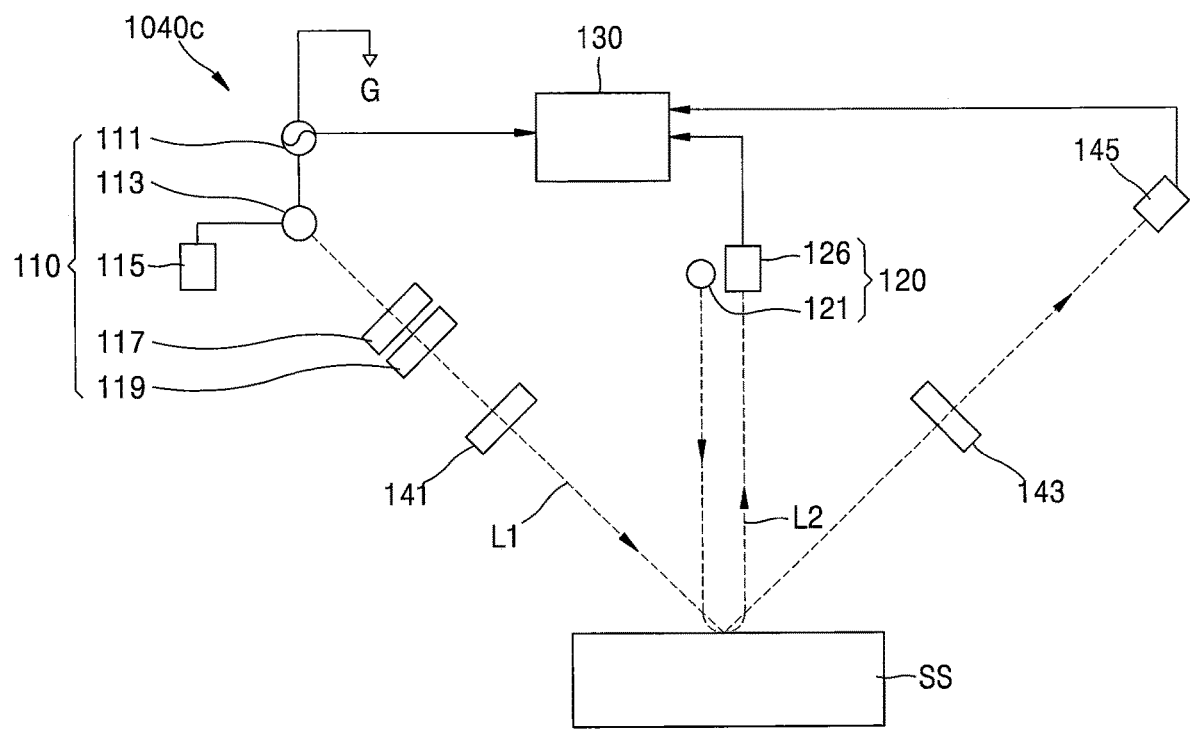

FIGS. 8 through 10 are cross-sectional views of inspection apparatuses according to some embodiments. Redundant descriptions that have been made with reference to FIG. 2 will be omitted, and descriptions below will be focused on the differences.

Referring to FIG. 8, an inspection apparatus 1040a may include a first optical module 110a. According to some embodiments, differently from the first optical module 110 in FIG. 2, the first optical module 110a may not include an intensity modulator. According to some embodiments, the power supply 111 connected to the first light source 113 may modulate the intensity of the first light L1. Accordingly, a separate intensity modulator may be omitted and the lock-in amplifier 130 may be connected to the power supply 111. Accordingly, the reference frequency of the lock-in amplifier 130 may be a frequency of effective supply power of the power supply 111.

Referring to FIG. 9, an inspection apparatus 1040b may include a first optical module 110b. According to some embodiments, differently from the first optical module 110 in FIG. 2, the first optical module 110b may not include an optical chopper. According to some embodiments, the intensity modulator 117 connected to the first light source 113 may chop or interrupt the first light L1. According to some embodiments, the intensity of the first light L1 is chopped using an electrical method instead of a mechanical method, and therefore, the range of a chopping frequency may be increased. According to some embodiments, the inspection apparatus 1040b may realize a higher chopping frequency as compared to the mechanical method, and therefore, chopping noise in proportional to 1/f may be reduced.

Referring to FIG. 10, an inspection apparatus 1040c may include a first polarizer 141, a second polarizer 143, and a polarization detector 145. According to some embodiments, each of the first polarizer 141 and the second polarizer 143 is an optical filter which passes waves of certain polarized light and blocks waves of other polarized light. According to some embodiments, a compensator may be provided between the first polarizer 141 and the second polarizer 143. The compensator is an optical device which alters the polarization state of light traveling through the compensator. The compensator may be a half-wave compensator, which shifts the polarization direction of linearly polarized light, or a quarter-wave compensator, which converts linearly polarized light into circularly polarized light and vice versa, but is not limited thereto.

The first light L1 emitted by the first optical module 110 may travel through the first polarizer 141, may be reflected from the semiconductor structure SS, may travel through the second polarizer 143, and may reach the polarization detector 145. When the first light L1 is reflected from the semiconductor structure SS, the polarization angle of the first light L1 may be rotated by the magneto-optic Kerr effect induced by magnetic materials included in the semiconductor structure SS. According to some embodiments, the polarization detector 145 may measure the rotation of polarization of the first light L1. In general, the rotation of a polarization angle by a magnetic field is very small. However, According to some embodiments, the lock-in amplifier 130 may amplify a measurement result of the polarization detector 145 using an intensity modulation frequency for the first light L1 as a reference frequency. At this time, a Kerr rotation angle of a single magnetic layer is about 0.008 degrees. According to the related art, a target of measurement of the Kerr rotation angle is cooled down to an extremely low temperature to reduce noise. According to some embodiments, the first light L1 has undergone frequency and intensity modulation, and thus, the lock-in amplifier 130 may greatly increase a signal-to-noise ratio of the rotation of a polarization angle. Accordingly, the rotation of a polarization angle due to the Kerr effect may be measured with respect to the semiconductor structure SS at room temperature, and the intensity and uniformity of magnetism of the semiconductor structure SS may be inspected using the measurement result.

FIG. 11 is a flowchart of a semiconductor structure manufacturing method according to some embodiments. FIGS. 12A through 12K are cross-sectional views for explaining a semiconductor structure manufacturing method, according to some embodiments.

Referring to FIG. 11, a fixed layer may be formed in operation P110. The forming of the fixed layer may include forming material layers between a wafer and the fixed layer.

Figure 12A:
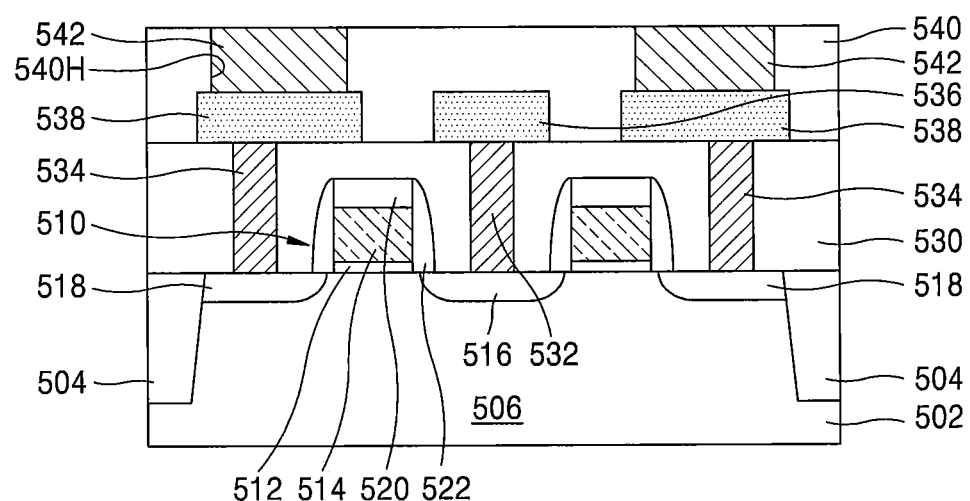
FIGS. 12A through 12K are cross-sectional views for explaining a semiconductor structure manufacturing method, according to some embodiments.

In detail, referring to FIG. 12A, an active region 506 may be defined by forming an isolation film 504 in a wafer 502, and a transistor 510 may be formed in the active region 506. According to some embodiments, the wafer 502 may include a semiconductor wafer. The wafer 502 may include Si. According to some embodiments, the wafer 502 may include a semiconductor element, e.g., Ge, or a compound semiconductor such as SiC, GaAs, InAs, or InP. According to some embodiments, the wafer 502 may include a silicon-on-insulator (SOI) structure. According to some embodiments, the wafer 502 may include a buried oxide layer. According to some embodiments, the wafer 502 may include a conductive region, e.g., an impurity-doped well or an impurity-doped structure. The isolation film 504 may include a shallow trench isolation (STI) structure.

The transistor 510 may include a gate insulating film 512, a gate electrode 514, a source region 516, and a drain region 518. A top surface of the gate electrode 514 may be insulated by an insulating capping pattern 520, and both sidewalls of the gate electrode 514 may be insulated by an insulating spacer 522.

Thereafter, a first interlayer dielectric film 530, which is planarized and covers the transistor 510, may be formed above the wafer 502. Thereafter, a first contact plug 532 electrically connected to the source region 516 and a second contact plug 534 electrically connected to the drain region 518 may be formed penetrating through the first interlayer dielectric film 530. A source line 536, which is electrically connected to the source region 516 via the first contact plug 532, and a conductive pattern 538, which is electrically connected to the drain region 518 via the second contact plug 534 at each of opposite sides of the source line 536, may be formed by forming a conductive layer on the first interlayer dielectric film 530 and patterning the conductive layer.

Thereafter, a second interlayer dielectric film 540 may be formed on the first interlayer dielectric film 530 to cover the source line 536 and the conductive pattern 538. A lower electrode contact hole 540H may be formed by partially removing the second interlayer dielectric film 540 using photolithography such that a top surface of the conductive pattern 538 is exposed. A lower electrode contact plug 542 may be formed by filling the lower electrode contact hole 540H with a conductive material and polishing the conductive material to expose a top surface of the second interlayer dielectric film 540. According to some embodiments, the lower electrode contact plug 542 includes at least one material selected from TiN, Ti, TaN, Ta, and W.

Figure 12B:
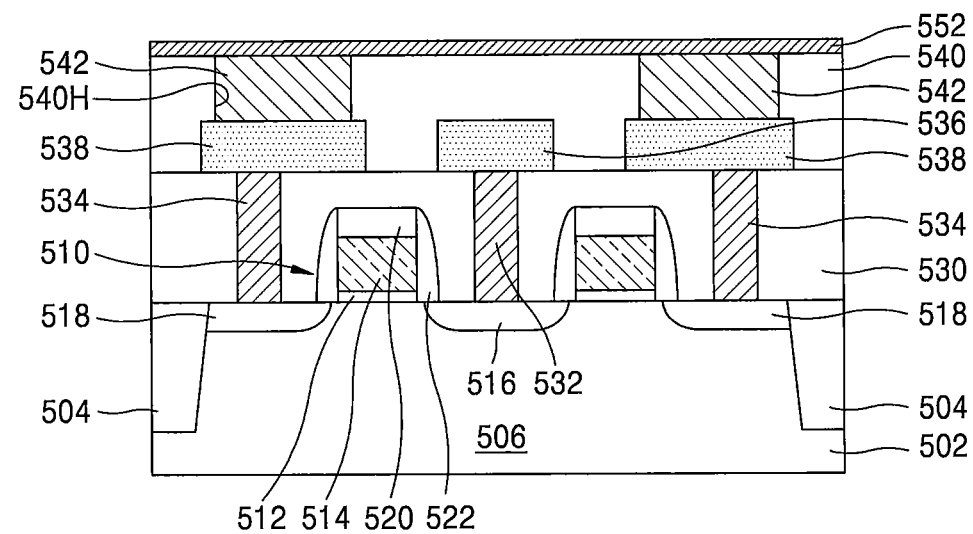

Thereafter, referring to FIG. 12B, a lower electrode layer 552 may be formed on the second interlayer dielectric film 540 and the lower electrode contact plug 542. In some embodiments, the lower electrode layer 552 may include a metal or a metal nitride. The lower electrode layer 552 may be formed using a process such as CVD, PVD, ALD, or reactive PLD.

Figure 12C:
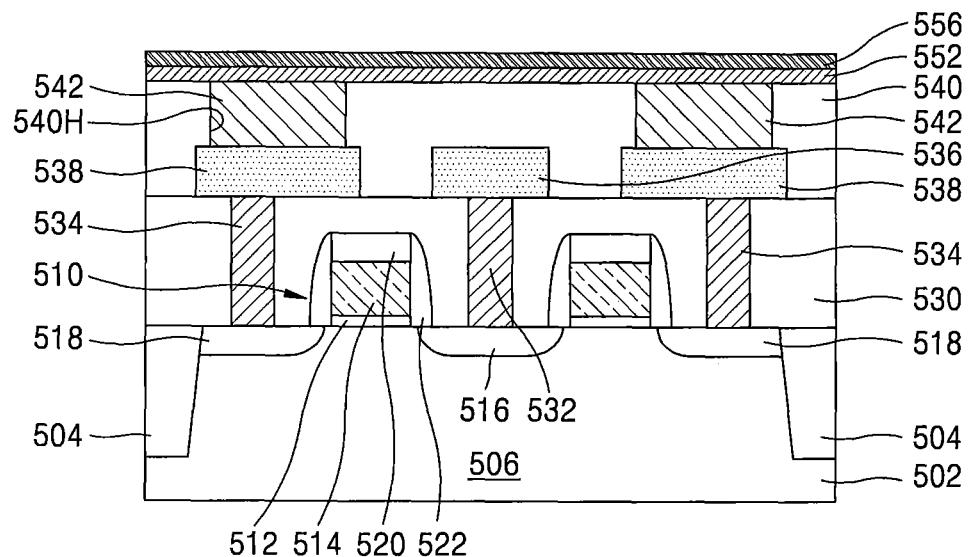

Thereafter, referring to FIG. 12C, a seed layer 556 may be formed on the lower electrode layer 552. The seed layer 556 may include a Ru layer, a Pt layer, or a Pd layer. The seed layer 556 may be formed using a process such as CVD, PVD, ALD, or reactive PLD. In some embodiments, the seed layer 556 may be formed using a DC magnetron sputtering process using krypton (Kr) as a sputtering gas.

Figure 12D:
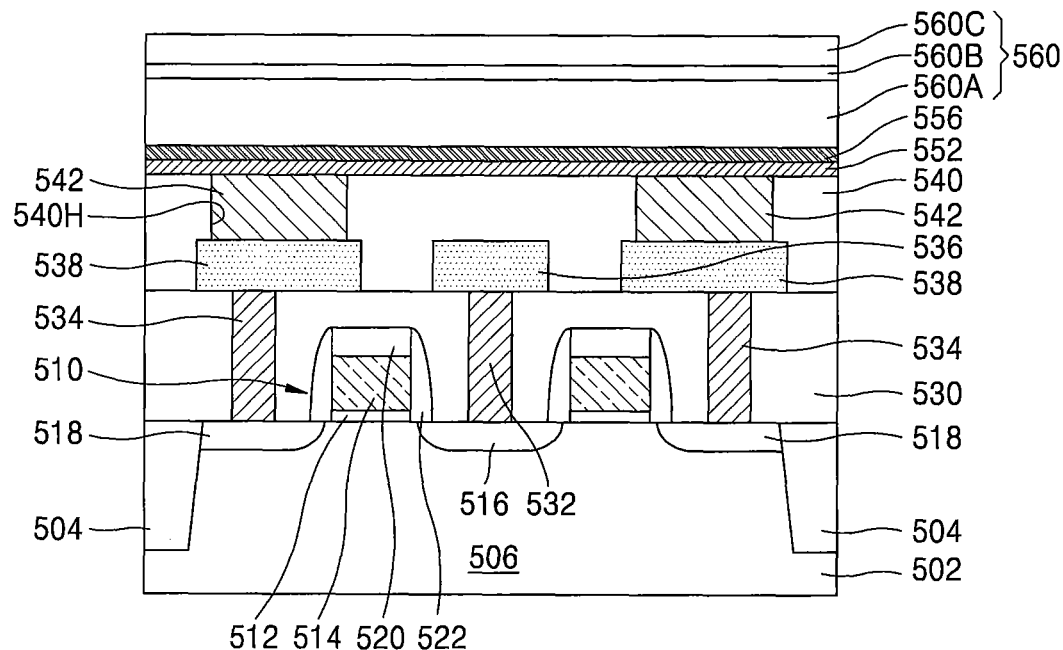

Thereafter, referring to FIG. 12D, a fixed layer 560 may be formed by sequentially forming a first ferromagnetic layer 560A, a non-magnetic thin film 560B, and a second ferromagnetic layer 560C on the seed layer 556. The description given with reference to FIG. 2A will be referred to for the details of the fixed layer 560 including the first ferromagnetic layer 560A, the non-magnetic thin film 560B, and the second ferromagnetic layer 560C.

The first ferromagnetic layer 560A, the non-magnetic thin film 560B, and the second ferromagnetic layer 560C may be formed using MBE or metal-organic CVD (MOCVD). The first ferromagnetic layer 560A, the non-magnetic thin film 560B, and the second ferromagnetic layer 560C may be formed at a relatively low process temperature of about 200° C. to about 400° C.

Thereafter, referring to FIGS. 10, 11, and 12D, the fixed layer 560 may be inspected for magnetism in operation P120. The inspection of magnetism of the fixed layer 560 may include comparing the intensity and uniformity of measured magnetism with preset threshold values. The inspection of magnetism of the fixed layer 560 may be performed using the method described with reference to FIG. 10.

Referring to FIGS. 11 and 12D, the magnetism of the fixed layer 560 is inspected after the first ferromagnetic layer 560A, the non-magnetic thin film 560B, and the second ferromagnetic layer 560C are sequentially formed, but embodiments are not limited thereto. For example, right after each of the first ferromagnetic layer 560A, the non-magnetic thin film 560B, and the second ferromagnetic layer 560C is formed and before a subsequent layer is formed, magnetism of each of the first ferromagnetic layer 560A, the non-magnetic thin film 560B, and the second ferromagnetic layer 560C may be inspected.

Referring to FIG. 11, a free layer may be formed in operation P130. The forming of the free layer may include forming material layers between the fixed layer and the free layer.

Figure 12E:
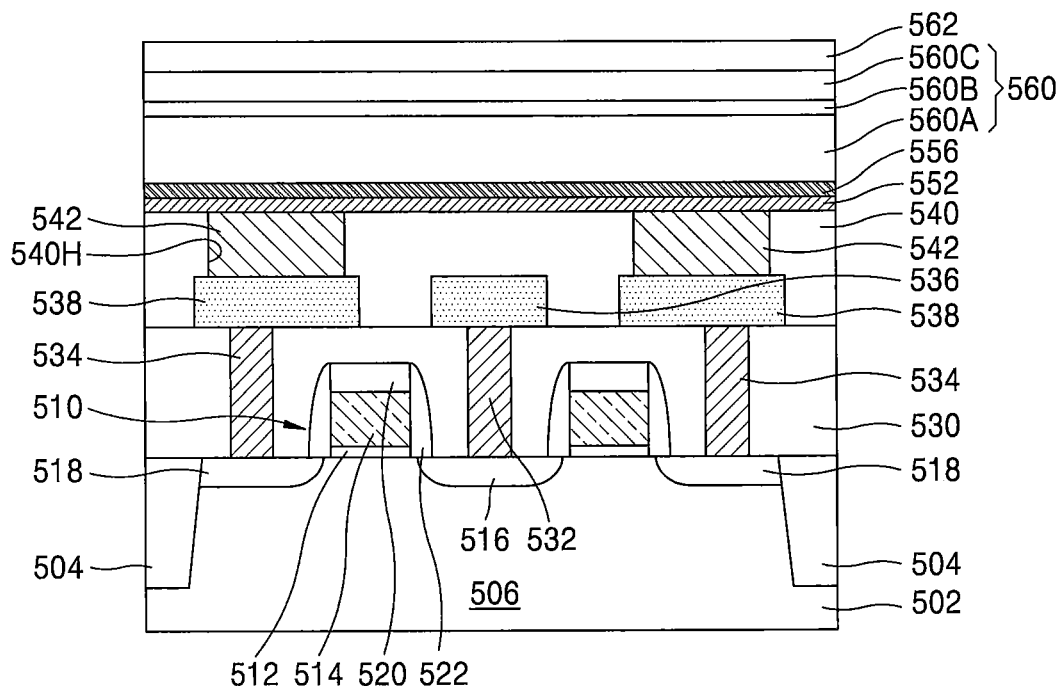

Referring to FIG. 12E, a blocking layer 562 may be formed on the fixed layer 560. The blocking layer 562 may include a material such as Mo, W, Ta, Ti, Zr, Hf, V, or Nb, an alloy thereof, or a combination thereof. The blocking layer 562 may be formed using a process such as ALD or sputtering.

Figure 12F:
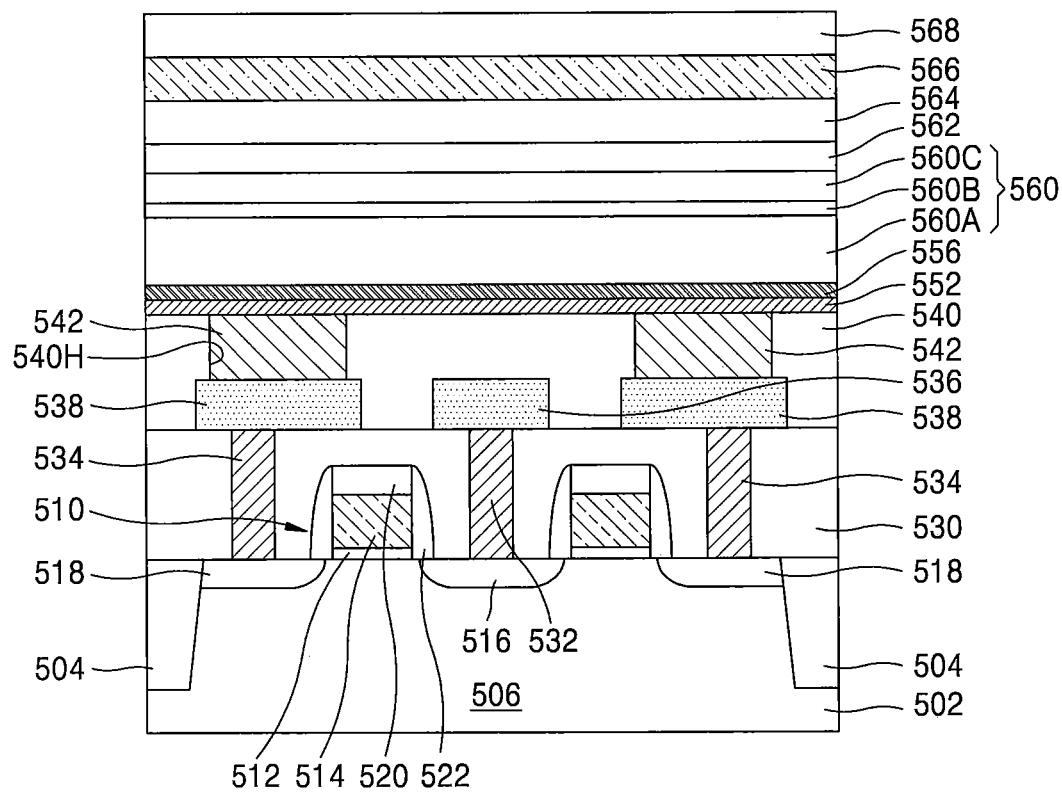

Referring to FIG. 12F, a polarization enhancement layer 564, a first tunnel barrier 566, and a free layer 568 may be subsequently formed on the blocking layer 562. The polarization enhancement layer 564 may include a CoFeB magnetic layer. The polarization enhancement layer 564 may have a thickness of about 10 Å to about 20 Å. The first tunnel barrier 566 may be substantially the same as the first tunnel barrier 60 described with reference to FIG. 4B. The free layer 568 may be substantially the same as the free layer 70 described with reference to FIG. 4B.

Thereafter, referring to FIGS. 10, 11, and 12F, the free layer 568 may be inspected for magnetism in operation P140. The inspection of magnetism of the free layer 568 may include comparing the intensity and uniformity of measured magnetism with preset threshold values. The inspection of magnetism of the free layer 568 may be performed using the method described with reference to FIG. 10.

Thereafter, referring to FIG. 11, a semiconductor structure may be etched in operation P150. According to some embodiments, the etching of the semiconductor structure may include providing a preset material layer and a mask pattern on the free layer 568 and etching the semiconductor structure using the mask pattern.

Figure 12G:
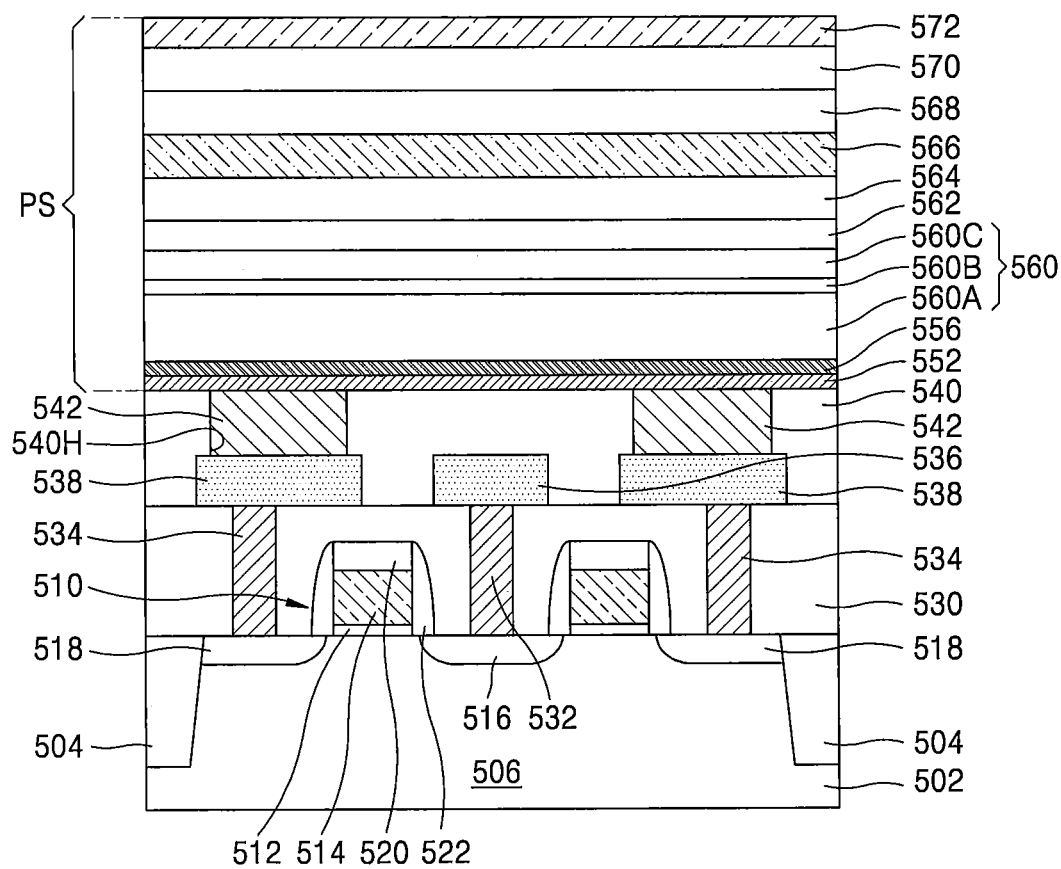

Referring to FIG. 12G, a second tunnel barrier 570 and a capping layer 572 may be formed. The second tunnel barrier 570 is substantially the same as the second tunnel barrier 80 described with reference to FIG. 4B. The capping layer 572 may include at least one material selected from Ta, Al, Cu, Au, Ti, TaN, and TiN. In some embodiments, the capping layer 572 may be omitted.

A stack structure PS, in which the lower electrode layer 552 through the capping layer 572 are sequentially stacked, is not limited to the embodiments discussed herein but may be modified and changed without departing from the scope of the inventive concept.

Figure 12H:
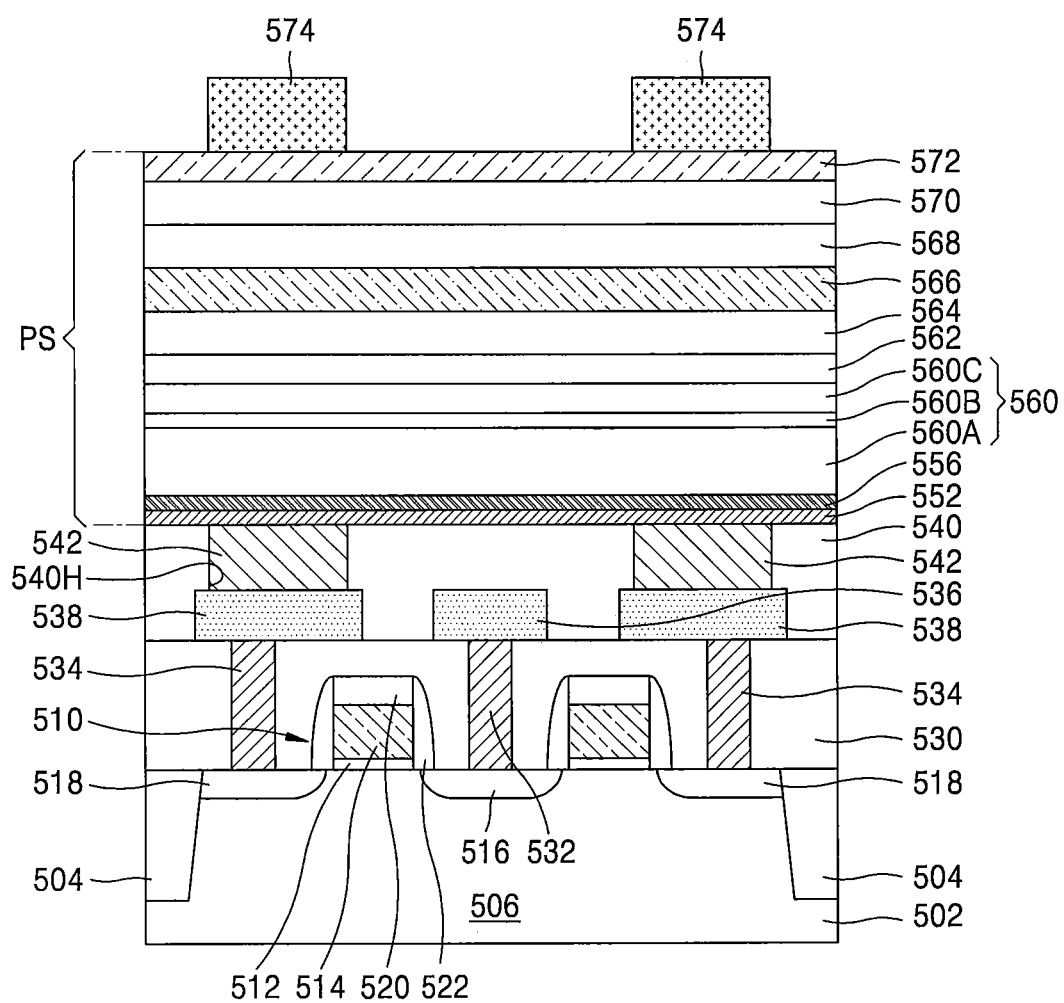

Referring to FIG. 12H, a plurality of conductive mask patterns 574 may be formed on the stack structure PS. The conductive mask patterns 574 may include a metal or a metal nitride. In some embodiments, the conductive mask patterns 574 may include at least one material selected from Ru, W, TiN, TaN, Ti, Ta, and a metallic glass alloy. For example, the conductive mask patterns 574 may have a double-layer structure such as Ru/TiN or TiN/W. Each of the conductive mask patterns 574 may be aligned with the lower electrode contact plug 542 lying thereunder.

Figure 12I:
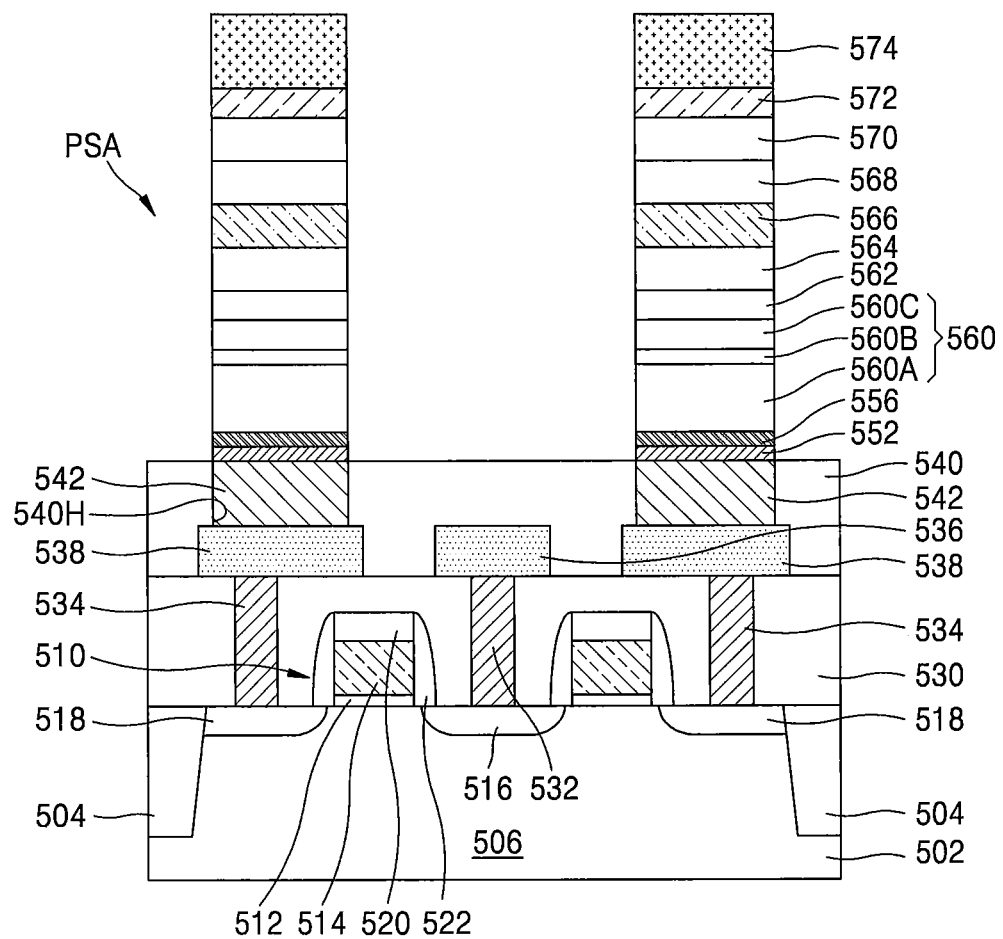

Referring to FIG. 12I, a plurality of magnetoresistive elements PSA may be formed by etching the stack structure PS using the conductive mask patterns 574 as etching masks. In some embodiments, to etch the stack structure PS, a resultant structure having the conductive mask patterns 574 may be loaded into a plasma etching chamber, and plasma etching may be performed on the resultant structure. In some embodiments, the stack structure PS may be etched using reactive ion etching (RIE), ion beam etching (IBE), or Ar milling. In some embodiments, the stack structure PS may be etched using a first etching gas including $SF_6$, $NF_3$, $SiF_4$, $CF_4$, $Cl_2$, $CH_3OH$, $CH_4$, $CO$, $NH_3$, $H_2$, $N_2$, HBr, or a combination thereof. In some embodiments, when the stack structure PS is etched, at least one first additional gas selected from Ne, Ar, Kr, and Xe may also be used in addition to the first etching gas.

The etching of the stack structure PS may be performed using plasma produced by an inductively coupled plasma (ICP) source, a capacitively coupled plasma (CCP) source, an electron cyclotron resonance (ECR) plasma source, a helicon-wave excited plasma (HWEP) source, or an adaptively coupled plasma (ACP) source.

The etching of the stack structure PS may further include an etching process using a second etching gas having a different composition than the first etching gas. The second etching gas may include a $SF_6$, $NF_3$, $SiF_4$, $CF_4$, $Cl_2$, $CH_3OH$, $CH_4$, $CO$, $NH_3$, $H_2$, $N_2$, HBr, or a combination thereof. In some embodiments, at least one second additional gas selected from Ne, Ar, Kr, and Xe may also be used during the etching process using the second etching gas.

The etching of the stack structure PS may be performed at a temperature of about −10° C. to about 65° C. under a pressure of about 2 mT to about 5 mT. During the etching of the stack structure PS, the conductive mask patterns 574 may be partially consumed starting from the top surfaces thereof by an etching atmosphere such that the thickness of the conductive mask patterns 574 may be decreased. The second interlayer dielectric film 540, which is exposed after the stack structure PS is etched, may be overetched by a certain thickness from the top surface thereof.

As a result of etching the stack structure PS, the magnetoresistive elements PSA may be respectively formed on lower electrode contact plugs 542. In the magnetoresistive elements PSA, a remaining portion of each of the conductive mask patterns 574 and the capping layer 572 may function as an upper electrode.

Thereafter, referring to FIG. 11, a reflectance of the semiconductor structure may be measured in operation P160. According to some embodiments, the reflectance of the semiconductor structure may be measured using one of the methods described with reference to FIGS. 2, 8, 9, and 10.

In the case of magnetic junction devices, arsenic acid produced as a by-product of an etching process during singulation of the magnetic junction devices may remain on side surfaces thereof and may cause failure such as an unintended short-circuit. According to some embodiments, a reflectance may be measured after singulation of magnetic devices, and existence or non-existence of arsenic acid remaining on side walls of the magnetic devices may be inspected.

Figure 12J:
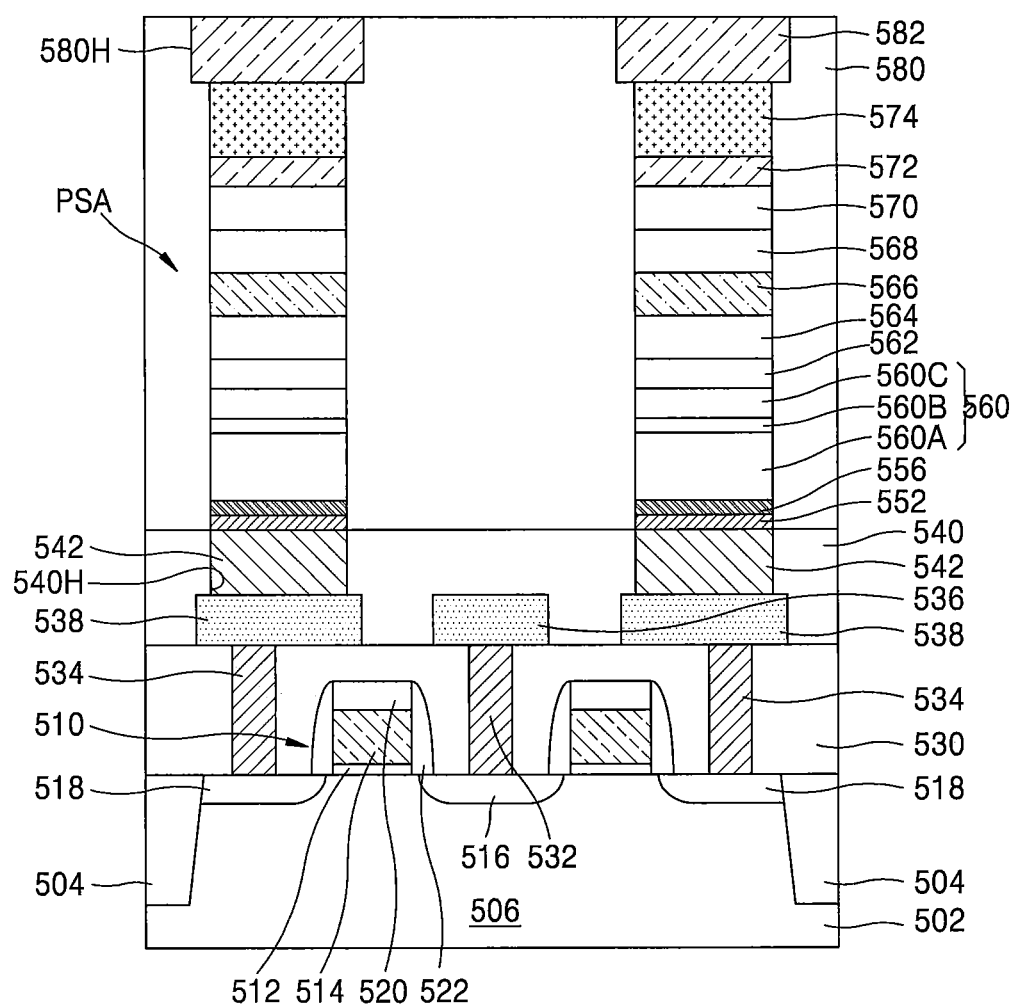

Referring to FIG. 12J, a third interlayer dielectric film 580 may be formed to cover the magnetoresistive elements PSA. A plurality of bit line contact holes 580H may be formed by etching a portion of the third interlayer dielectric film 580 to expose the top surface of the conductive mask patterns 574 respectively included in the magnetoresistive elements PSA. Thereafter, a conductive layer may be formed to fill the bit line contact holes 580H. A plurality of bit line contact plugs 582 may be respectively formed in the bit line contact holes 580H by polishing or etching back the conductive layer so that the top surface of the third interlayer dielectric film 580 is exposed.

Figure 12K:
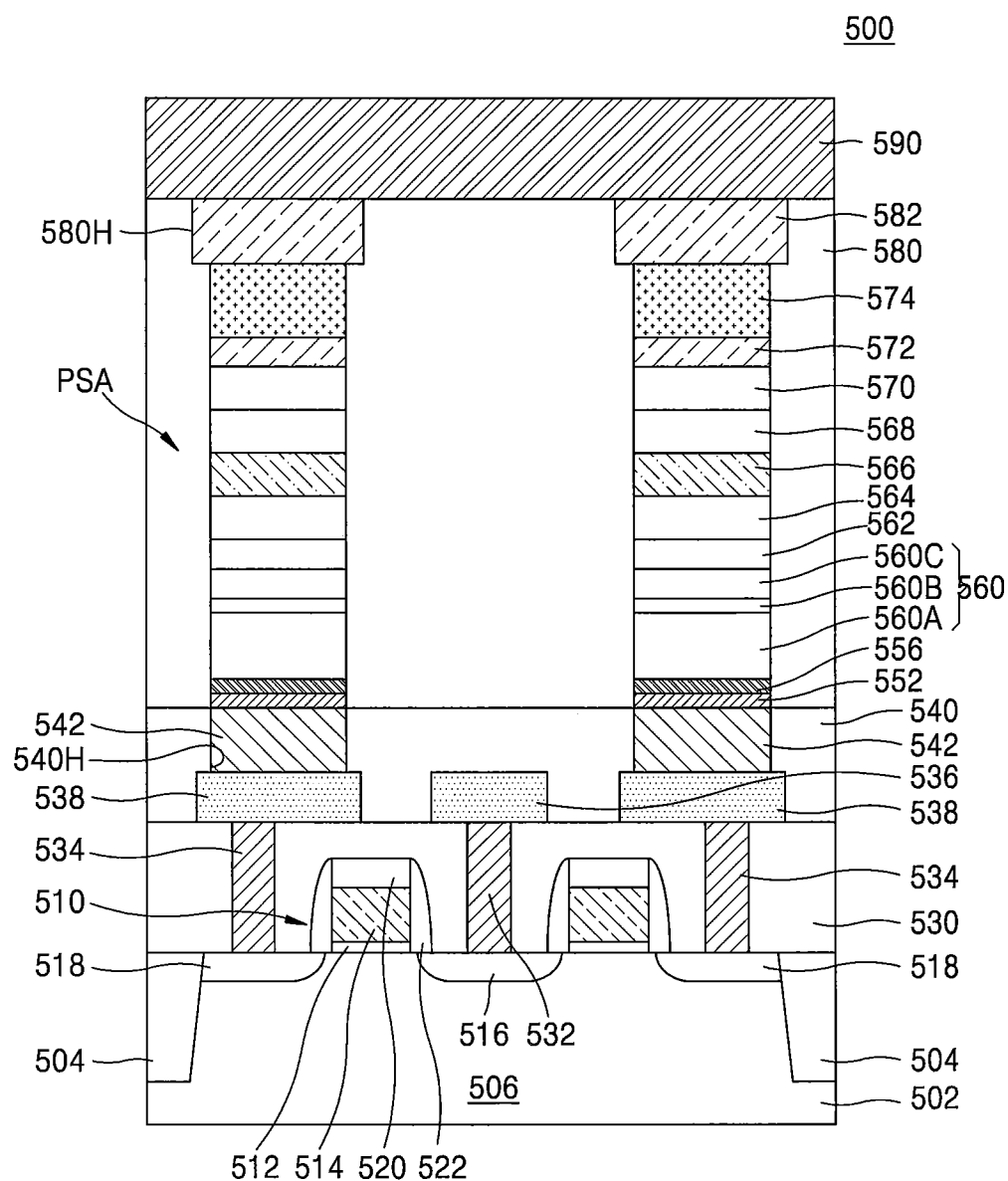

Referring to FIG. 12K, a conductive layer for forming a bit line may be formed on the third interlayer dielectric film 580 and the bit line contact plugs 582 and then patterned such that a bit line 590, which is electrically connected to the bit line contact plugs 582 and has a line shape, may be formed. As a result, a magnetic device 500 may be provided.

While the inventive concept has been particularly shown and described with reference to embodiments thereof, it will be understood that various changes in form and details may be made therein without departing from the spirit and scope of the following claims.

What is claimed is:

1. An inspection apparatus comprising:
   a first optical module comprising a first light source configured to emit first light to a semiconductor structure;
   a second optical module comprising a second light source and a detector, wherein the second light source is configured to emit second light different from the first light to a second portion adjacent to a first portion to which the first light is emitted in the semiconductor structure, and wherein the detector is configured to detect the second light reflected toward the second light source;
   a lock-in amplifier connected to the first optical module and the detector; and
   a frequency modulator configured to shift a frequency and a wavelength of the first light.

2. The inspection apparatus of claim 1, wherein the second light source emits the second light perpendicular to a top surface of the semiconductor structure.

3. The inspection apparatus of claim 1, wherein the first optical module obliquely emits the first light to a top surface of the semiconductor structure.

4. The inspection apparatus of claim 1, wherein the first optical module further comprises:
a power supply configured to supply power to the first light source,
wherein the frequency modulator is configured to modulate the frequency of the first light.

5. The inspection apparatus of claim 4, wherein the frequency modulator is configured to increase the frequency of the first light as a step function.

6. The inspection apparatus of claim 4, wherein the frequency modulator is configured to decrease the frequency of the first light as a step function.

7. The inspection apparatus of claim 4,
wherein the frequency modulator is configured to modulate the frequency of the first light such that the first light alternately has a first frequency and a second frequency, and
wherein the first frequency is different from the second frequency.

8. The inspection apparatus of claim 1,
wherein the first optical module further comprises an optical chopper in a path of the first light toward the semiconductor structure, and
wherein the optical chopper is configured to periodically interrupt the first light.

9. The inspection apparatus of claim 1,
wherein the first optical module further comprises an intensity modulator that is separated from the frequency modulator and is in a path of the first light toward the semiconductor structure, and
wherein the intensity modulator is configured to modulate an intensity of the first light.

10. The inspection apparatus of claim 1, further comprising:
a first polarizer in a first path of the first light from the first optical module toward the semiconductor structure.

11. The inspection apparatus of claim 10, further comprising:
a second polarizer in a second path of the first light that has been reflected from the semiconductor structure.

12. The inspection apparatus of claim 11, further comprising:
a polarization detector in a third path of the first light that has traveled through the second polarizer.

13. An inspection apparatus comprising:
a first optical module comprising a first light source configured to emit first light obliquely incident to a top surface of a semiconductor structure and a frequency modulator configured to modulate a frequency of the first light;
a second light source configured to emit second light different from the first light to a second portion adjacent to a first portion to which the first light is emitted in the semiconductor structure, wherein the second light is configured to be perpendicularly incident to the top surface of the semiconductor structure;
a detector configured to detect the second light reflected toward the second light source; and
a lock-in amplifier connected to the first optical module and the detector,
wherein the frequency modulator configured to shift the frequency and a wavelength of the first light.

14. The inspection apparatus of claim 13, wherein the first optical module further comprises a power supply configured to supply power to the first light source and to modulate an intensity of the first light.

15. The inspection apparatus of claim 14, wherein the lock-in amplifier is connected to the power supply.

16. The inspection apparatus of claim 13,
wherein the first optical module further comprises an intensity modulator in a path of the first light toward the semiconductor structure, and
wherein the intensity modulator is configured to modulate an intensity of the first light.

17. The inspection apparatus of claim 16, wherein the lock-in amplifier is connected to the intensity modulator.

18. The inspection apparatus of claim 13,
wherein the first optical module further comprises an optical chopper in a path of the first light toward the semiconductor structure, and
wherein the optical chopper is configured to modulate an intensity of the first light.

19. The inspection apparatus of claim 18, wherein the lock-in amplifier is connected to the optical chopper.

20. A semiconductor structure manufacturing apparatus comprising:
a process module comprising at least one of a deposition device and an etching device,
wherein the deposition device is configured to deposit material layers comprising magnetic layers on a semiconductor structure, and wherein the etching device is configured to etch at least a portion of the material layers; and
an inspection apparatus configured to inspect the semiconductor structure,
wherein the inspection apparatus comprises:
a first optical module comprising a first light source configured to emit first light to the semiconductor structure;
a second light source configured to emit second light different from the first light to a second portion adjacent to a first portion to which the first light is emitted in the semiconductor structure;
a detector configured to detect the second light reflected toward the second light source; and
a lock-in amplifier connected to the first optical module and the detector; and
a frequency modulator configured to shift a frequency and a wavelength of the first light.

* * * * *